US 11,785,768 B2

(12) United States Patent
Jung et al.

(10) Patent No.: US 11,785,768 B2
(45) Date of Patent: Oct. 10, 2023

(54) THREE-DIMENSIONAL SEMICONDUCTOR MEMORY DEVICES

(71) Applicant: Samsung Electronics Co., Ltd., Suwon-si (KR)

(72) Inventors: Euntaek Jung, Seongnam-si (KR); Joongshik Shin, Yongin-si (KR); Dongyoun Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 93 days.

(21) Appl. No.: 17/360,349

(22) Filed: Jun. 28, 2021

(65) Prior Publication Data

US 2021/0327892 A1 Oct. 21, 2021

Related U.S. Application Data

(63) Continuation of application No. 16/152,605, filed on Oct. 5, 2018, now Pat. No. 11,063,057.

(30) Foreign Application Priority Data

Apr. 30, 2018 (KR) ........................ 10-2018-0049926

(51) Int. Cl.
*H01L 27/11519* (2017.01)
*H10B 41/27* (2023.01)
(Continued)

(52) U.S. Cl.
CPC ............. *H10B 41/27* (2023.02); *H10B 41/10* (2023.02); *H10B 41/35* (2023.02); *H10B 43/10* (2023.02); *H10B 43/27* (2023.02); *H10B 43/35* (2023.02)

(58) Field of Classification Search
None
See application file for complete search history.

(56) References Cited

U.S. PATENT DOCUMENTS 9,012,974 B2  4/2015  Chae et al.
9,508,730 B2  11/2016  Lee et al.
(Continued)

FOREIGN PATENT DOCUMENTS

CN  106992184 A  7/2017
CN  107425005 A  12/2017
(Continued)

*Primary Examiner* — Joseph C. Nicely
*Assistant Examiner* — Lamont B Koo
(74) *Attorney, Agent, or Firm* — Harness, Dickey & Pierce, P.L.C.

(57) ABSTRACT

A three-dimensional semiconductor memory device includes a substrate, an electrode structure including a plurality of gate electrodes sequentially stacked on the substrate in a first direction that extends perpendicular to an upper surface of the substrate, a source conductive pattern between the substrate and the electrode structure, a vertical semiconductor pattern penetrating the electrode structure and the source conductive pattern, and a data storage pattern extending in the first direction between the vertical semiconductor pattern and the electrode structure. A lower surface of the data storage pattern contacts the source conductive pattern. A portion of the lower surface of the data storage pattern is at a different height from the upper surface of the substrate, in relation to a height of another portion of the lower surface of the data storage pattern from the upper surface of the substrate.

20 Claims, 33 Drawing Sheets

(51) Int. Cl.
*H10B 41/10* (2023.01)
*H10B 41/35* (2023.01)
*H10B 43/10* (2023.01)
*H10B 43/27* (2023.01)
*H10B 43/35* (2023.01)

(56) References Cited

U.S. PATENT DOCUMENTS

| | | |
|---|---|---|
| 9,530,781 B2 | 12/2016 | Miyamoto et al. |
| 9,583,439 B1 | 2/2017 | Chen |
| 9,627,405 B1 | 4/2017 | Lee |
| 9,685,452 B2 | 6/2017 | Lee et al. |
| 9,711,532 B2 | 7/2017 | Miyamoto et al. |
| 9,716,099 B2 | 7/2017 | Choi |
| 9,799,670 B2 | 10/2017 | Nishikawa et al. |
| 9,831,266 B2 | 11/2017 | Kai et al. |
| 2016/0276365 A1 | 9/2016 | Choi et al. |
| 2016/0343730 A1 | 11/2016 | Son et al. |
| 2016/0365352 A1 | 12/2016 | Nishikawa et al. |
| 2017/0148811 A1 | 5/2017 | Zhang et al. |
| 2017/0207226 A1 | 7/2017 | Lee |
| 2017/0373089 A1 | 12/2017 | Kim et al. |

FOREIGN PATENT DOCUMENTS

| | | |
|---|---|---|
| KR | 2017-0086347 A | 7/2017 |
| KR | 2018-0003191 A | 1/2018 |

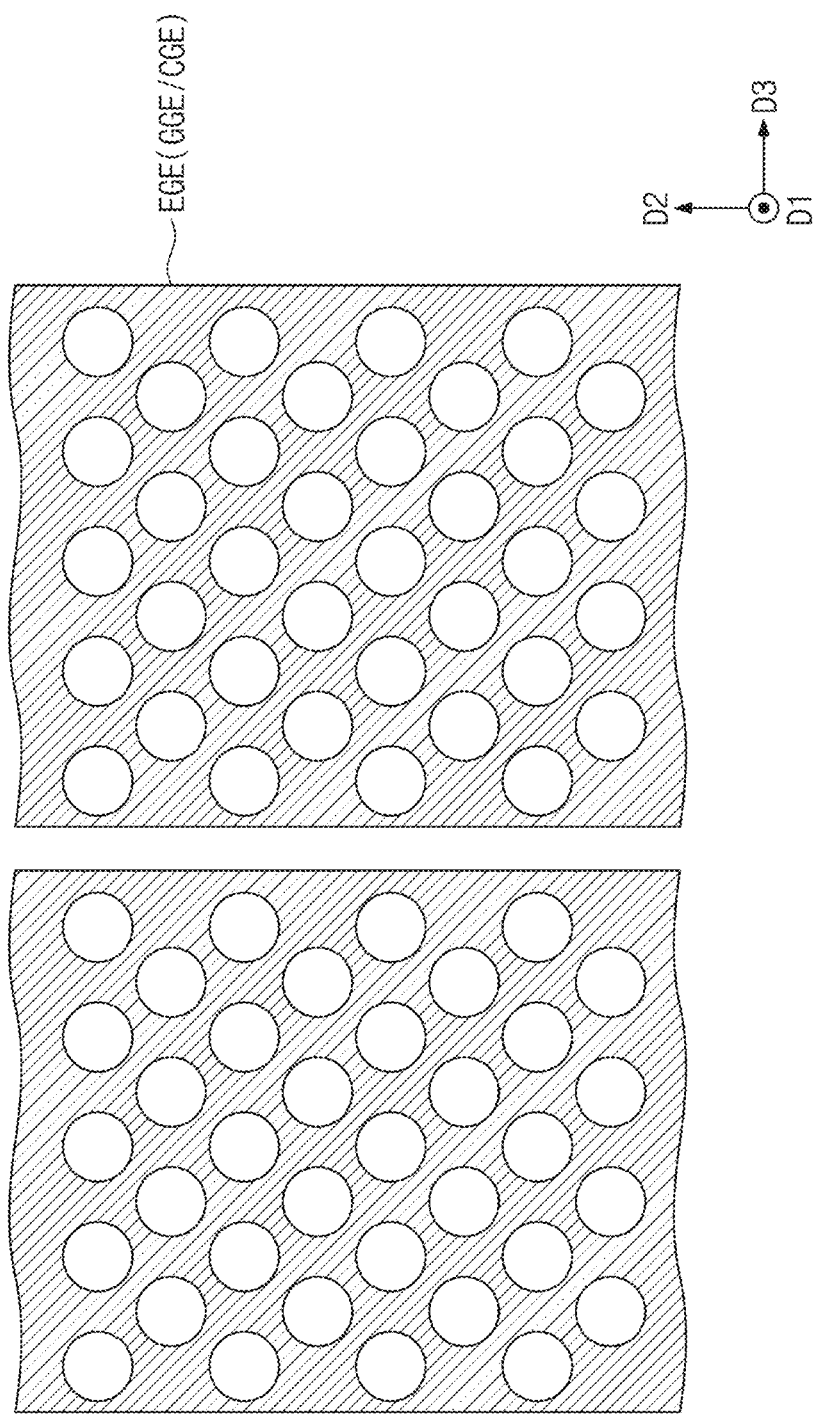

THREE-DIMENSIONAL SEMICONDUCTOR MEMORY DEVICES

CROSS-REFERENCE TO RELATED APPLICATIONS

This application is a continuation of U.S. application Ser. No. 16/152,605, filed on Oct. 5, 2018, which claims priority under 35 U.S.C. § 119 to Korean Patent Application No. 10-2018-0049926 filed on Apr. 30, 2018 in the Korean Intellectual Property Office, the disclosure of each of which is hereby incorporated by reference in its entirety.

BACKGROUND

Technical Field

Some example embodiments of the present disclosure relate to three-dimensional semiconductor devices, and, more specifically, to three-dimensional semiconductor memory devices including memory cells arranged three-dimensionally.

Discussion of Related Art

Semiconductor devices may be highly integrated to meet demands of high performance and low costs. For example, an integration degree of a two-dimensional (2D) or planar semiconductor device may be based on an area thereof that is used for a unit memory cell. Therefore, the integration density of the 2D or planar semiconductor device may be based on a technique used for a fine pattern formation. However, relatively high-cost equipment is utilized for manufacture of such a fine pattern formation in a 2D or planar semiconductor manufacturing process and an increase of the integration density of the 2D or planar semiconductor device may be limited.

SUMMARY

Three-dimensional semiconductor memory devices including three-dimensional memory cells have been developed to overcome the above limitations.

According to some example embodiments of the inventive concepts, a three-dimensional semiconductor memory device may include a substrate, an electrode structure on the substrate, a source conductive pattern between the substrate and the electrode structure, a vertical semiconductor pattern penetrating the electrode structure and the source conductive pattern, and a data storage pattern extending in the first direction between the vertical semiconductor pattern and the electrode structure. The electrode structure may include a plurality of gate electrodes sequentially stacked in a first direction, where the first direction extends perpendicular to an upper surface of the substrate. A lower surface of the data storage pattern may contact the source conductive pattern. A portion of the lower surface of the data storage pattern may be at a different height from the upper surface of the substrate, in relation to a height of another portion of the lower surface of the data storage pattern from the upper surface of the substrate.

According to some example embodiments of the inventive concepts, a three-dimensional semiconductor memory device may include a substrate, an electrode structure on the substrate, a source conductive pattern between the substrate and the electrode structure, a vertical semiconductor pattern penetrating the electrode structure and the source conductive pattern, and a data storage pattern extending in the first direction between the vertical semiconductor pattern and the electrode structure. The electrode structure may include a plurality of gate electrodes sequentially stacked in a first direction, where the first direction extends perpendicular to an upper surface of the substrate. A lower surface of the data storage pattern contacts the source conductive pattern. The lower surface of the data storage pattern may be substantially flat.

BRIEF DESCRIPTION OF THE DRAWINGS

FIG. 5 is a plan view illustrating an erase gate electrode EGE, a ground select gate electrode GGE, and cell gate electrodes CGE of FIG. 3.

DETAILED DESCRIPTION

Various some example embodiments will now be described more fully with reference to the accompanying drawings in which some example embodiments are shown. However, the inventive concepts may be embodied in many alternate forms and should not be construed as limited to only some example embodiments set forth herein.

Figure 1:
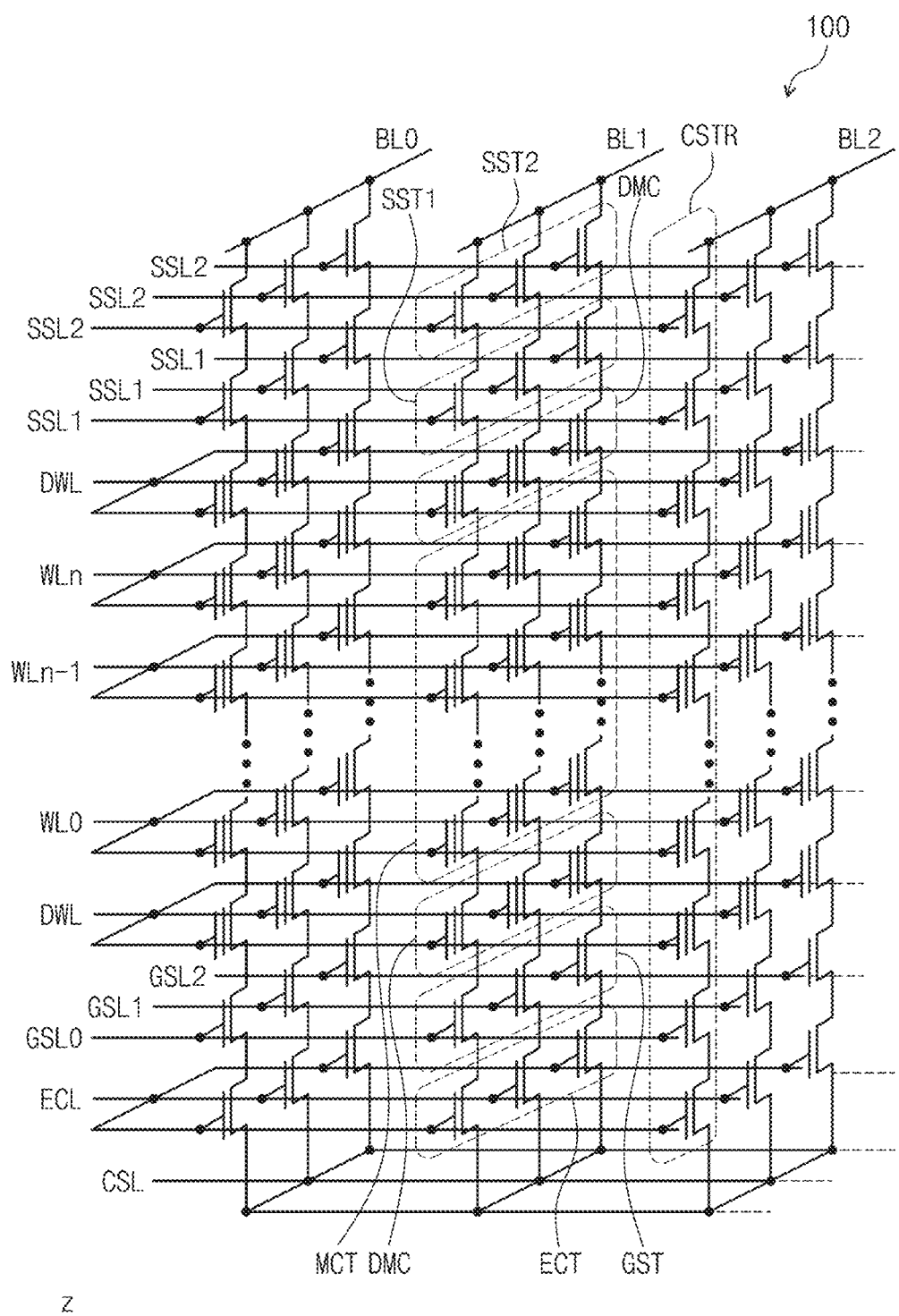
FIG. 1 is a schematic circuit diagram illustrating a cell array of a three-dimensional semiconductor memory device according to some example embodiments.

FIG. 1 is a schematic circuit diagram illustrating a cell array of a three-dimensional semiconductor memory device 100 according to some example embodiments.

Referring to FIG. 1, the three-dimensional (3D) semiconductor memory device 100 may include a common source line CSL, a plurality of bit lines BL0-BL2, and a plurality of cell strings CSTR between the common source line CSL and the bit lines BL0-BL2. The plurality of cell strings CSTR may be connected in parallel to each of the bit lines BL0-BL2. The cell strings CSTR may be connected in common to the common source line CSL. For example, the cell strings CSL may be disposed between the bit lines BL0-BL2 and one common source line CSL. In some example embodiments, the common source line CSL may include a plurality of common source lines that are arranged in two dimensions. In this case, a same electrical voltage may be applied to the common source lines CSL, or each of the common source lines CSL may be independently controlled.

Each of the cell strings CSTR may include string select transistors SST1 and SST2, memory cell transistors MCT, a ground select transistor GST, and an erase control transistor ECT, that are connected in series. Each of the memory cell transistors MCR may include a data storage element. In some example embodiments, each of the cell strings CSTR may include first and second string select transistors SST1 and SST2 that are connected in series, and the second string select transistor SST2 may be connected to a corresponding one of the bit lines BL0-BL2. In other embodiments, each of the cell strings CSTR may include one string select transistor. In some example embodiments, the ground select transistor GST of each of the cell strings CSTR may include a plurality of MOS transistors that are connected in series, similar to the first and second string select transistors SST1 and SST2.

The memory cell transistors MCT of each of the cell strings CSTR may be positioned at different distances from the common source line CSL. The memory cell transistors MCT may be connected in series between the first string select transistor SST1 and the ground select transistor GST. The erase control transistor ECT of each of the cell strings CSTR may be connected between the ground select transistor GST and the common source line CSL. In some example embodiments, each of the cell strings CSTR may include dummy cells DMC connected between the first string select transistor SST1 and an adjacent one of the memory cell transistors MCT and/or between the ground select transistor GST and an adjacent one of the memory cell transistors MCT.

The first string select transistor SST1 may be controlled by a first string select line SSL1. The second string select transistor SST2 may be controlled by a second string select line SSL2. The memory cell transistors MCT may be controlled by a plurality of word lines WL0-WLn. Each of the dummy cells DMC may be controlled by a dummy word line DWL. In addition, the ground select transistor GST may be controlled by a ground select line GSL. The erase control transistor ECT may be controlled by an erase control line ECL. The common source line CSL may be connected in common to sources of the erase control transistors ECT of respective ones of the cell strings CSTR.

Gate electrodes of the memory cell transistors MCT, positioned at substantially the same distance (e.g., the same distance within manufacturing tolerances and/or material tolerances) from the common source line CSL, may be connected in common to one of the word lines WL0-WLn, and DWL, and thus may be in an equal electrical potential state. In some example embodiments, although the gate electrodes of the memory cell transistors MCT are positioned at substantially the same level (e.g., the same level within manufacturing tolerances and/or material tolerances) from the common source line CSL, the gate electrodes disposed in different rows or columns may be independently controlled.

The ground select lines GSL0-GSL2 and the string select lines SSL1 and SSL2 may extend in an x direction and may be respectively spaced apart from each other in a y direction. The ground select lines GSL0-GSL2 positioned at substantially the same level (e.g., the same level within manufacturing tolerances and/or material tolerances) from the common source line CSL may be electrically separated from each other, and the string select transistors SSL1 or SSL2 positioned at substantially the same level (e.g., the same level within manufacturing tolerances and/or material tolerances) from the common source line CSL may be electrically separated from each other. In addition, the erase control transistors ECT of the respective cell strings CSTR may be controlled by the common erase control line ECL. The erase control transistors ECT may generate a gate induced drain leakage (GIDL) current during an erase operation of the memory cell array.

Figure 2:
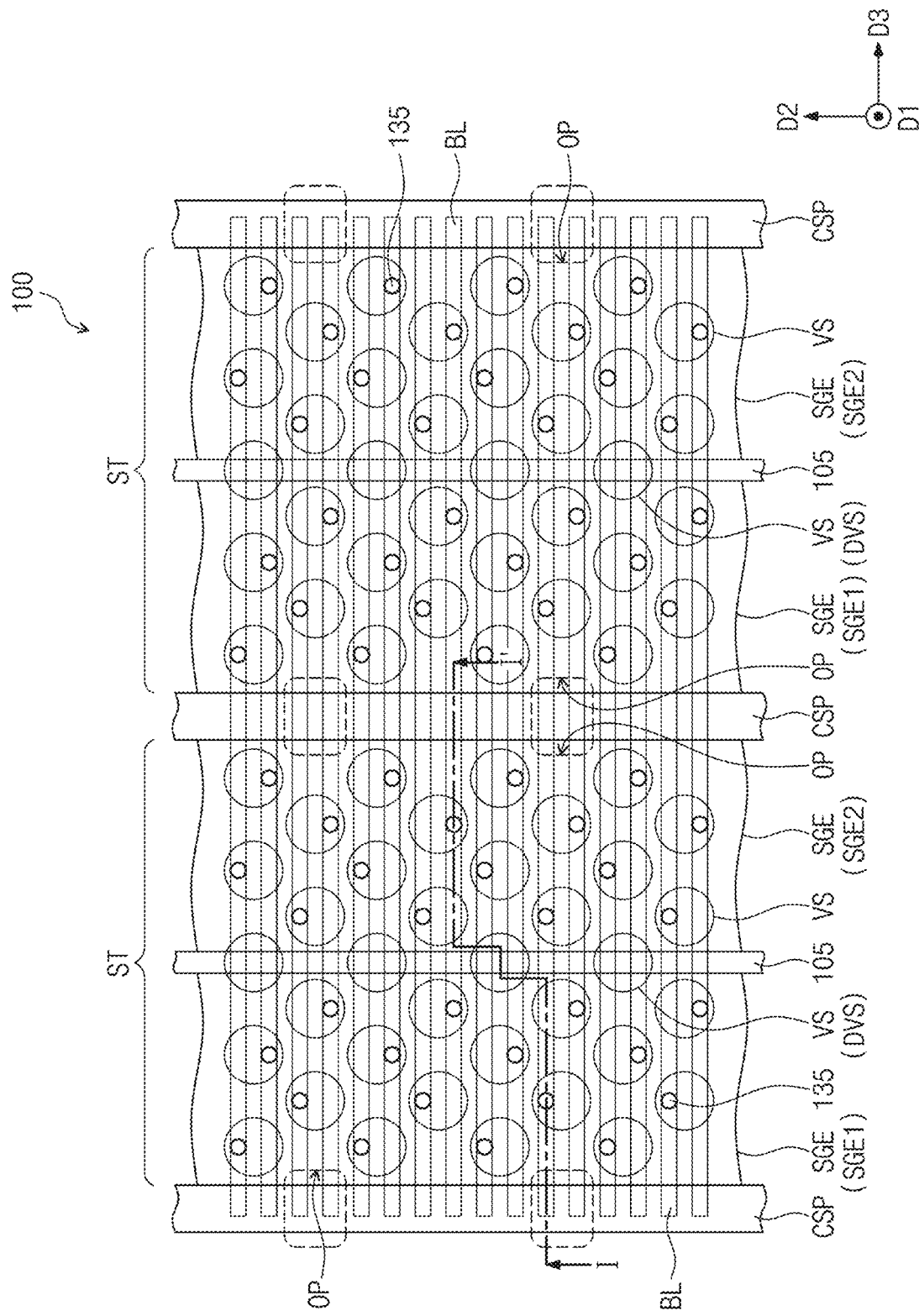
FIG. 2 is a plan view illustrating a three-dimensional semiconductor memory device according to some example embodiments.
Figure 3:
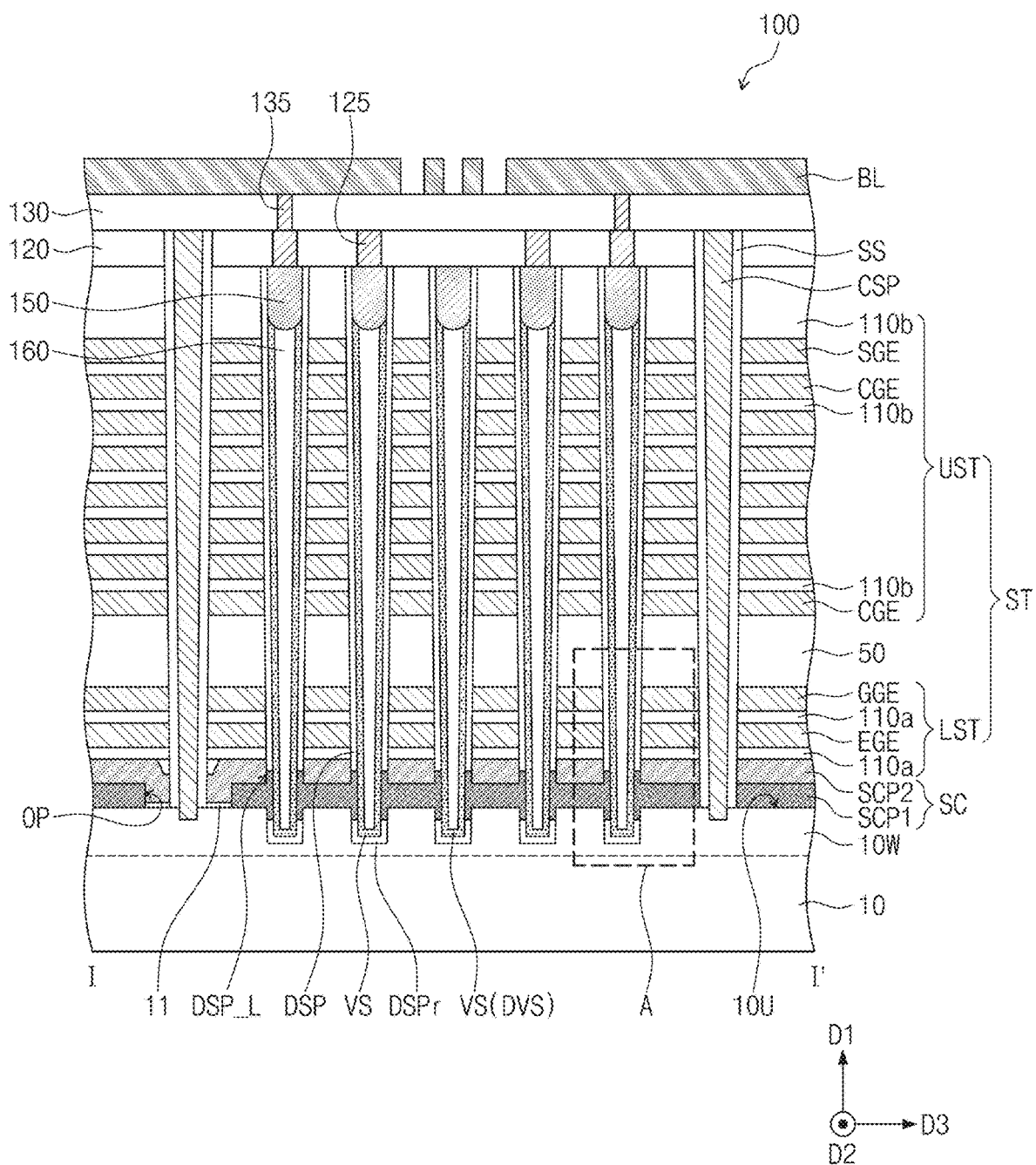
FIG. 3 is a cross-sectional view taken along line I-I' of FIG. 2.
Figure 4:
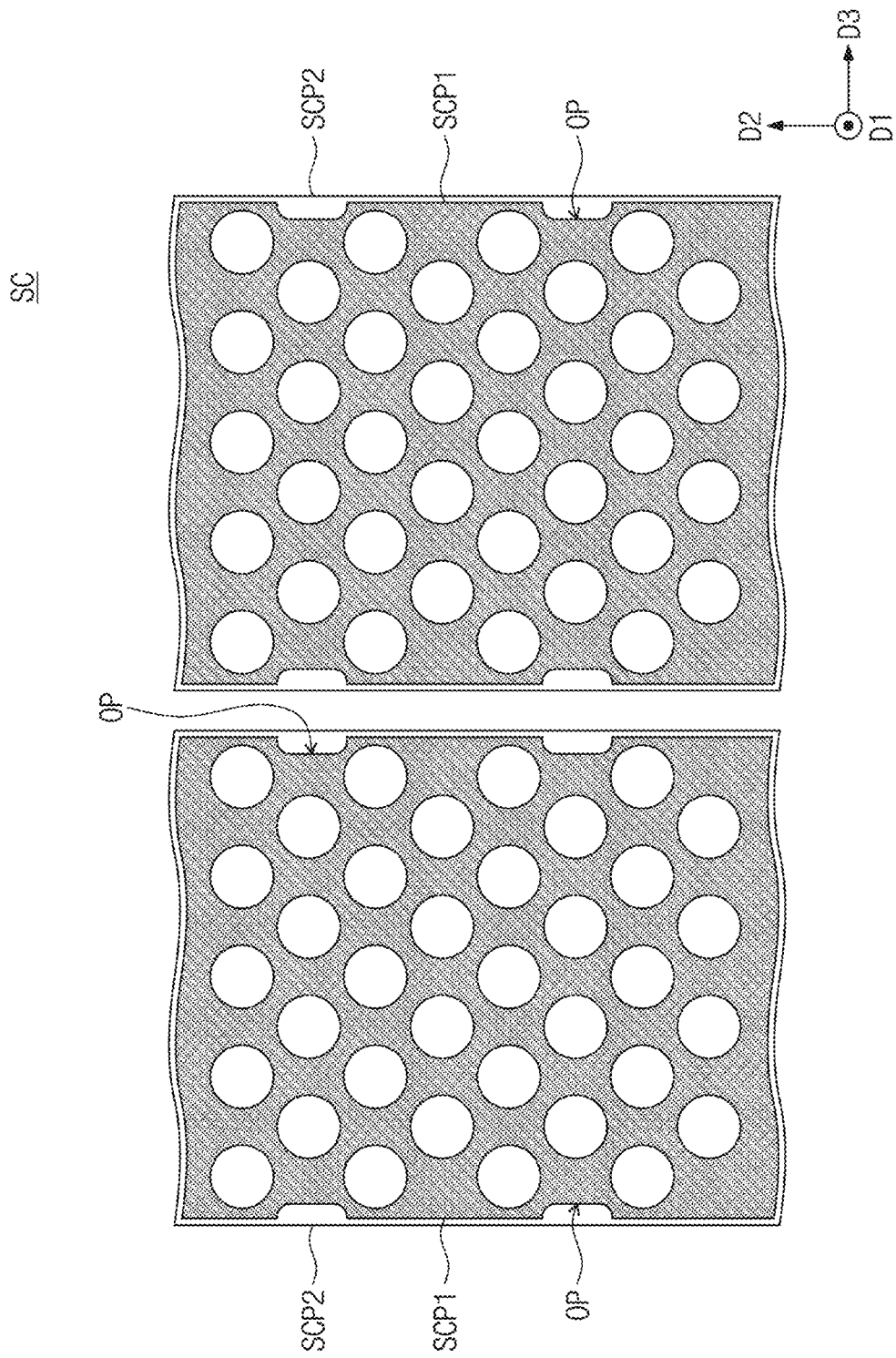
FIG. 4 is a plan view taken illustrating a source structure SC of FIG. 3.
Figure 6A:
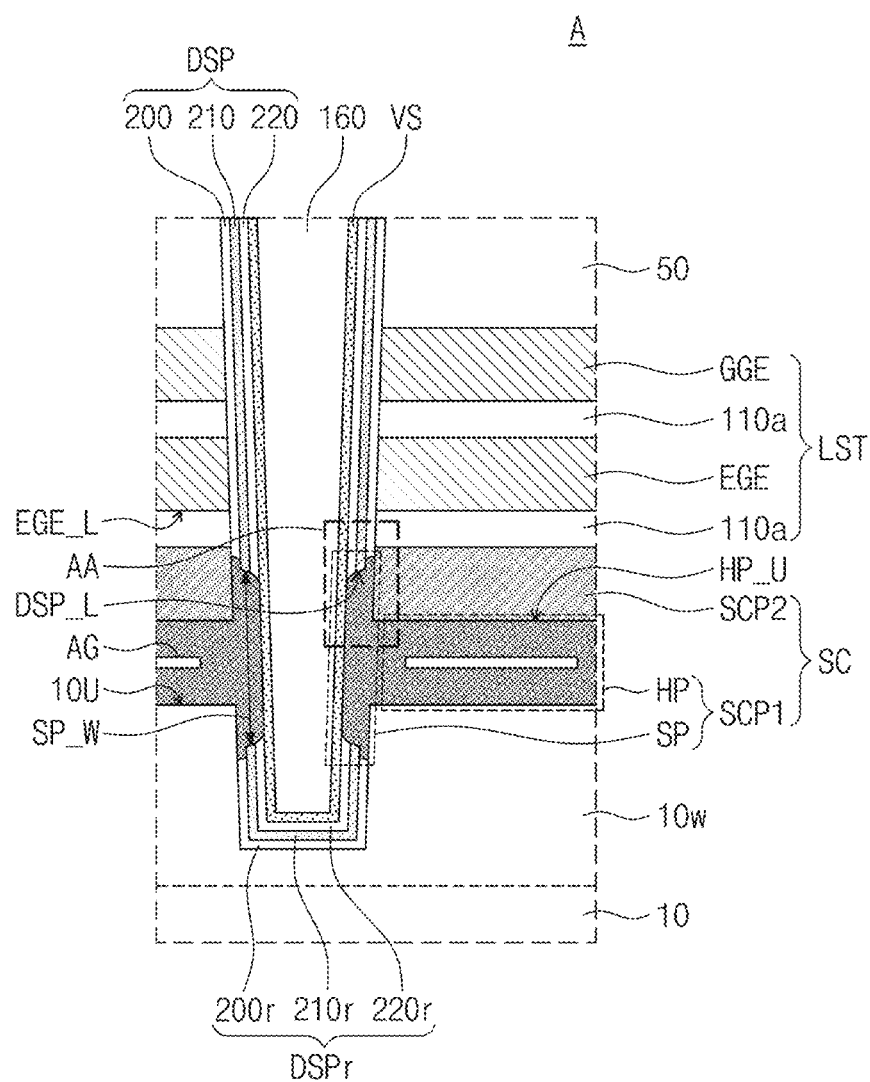
FIG. 6A is an enlarged view of portion A of FIG. 3.
Figure 6B:
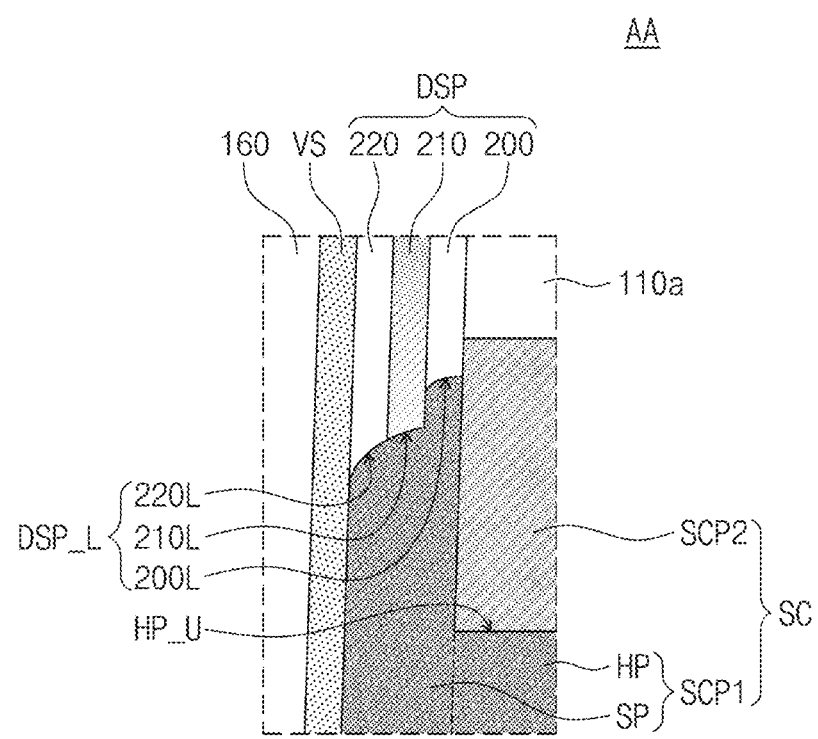
FIG. 6B is an enlarged view of portion AA of FIG. 6A.

FIG. 2 is a plan view illustrating a three-dimensional semiconductor memory device 100 according to some example embodiments. FIG. 3 is a cross-sectional view taken along line I-I' of FIG. 2. FIG. 4 is a plan view taken illustrating a source structure SC of FIG. 3. FIG. 5 is a plan view illustrating an erase gate electrode (EGE), a ground select gate electrode (GGE), and cell gate electrodes (CGE) of FIG. 3. FIG. 6A is an enlarged view of portion A of FIG. 3. FIG. 6B is an enlarged view of portion AA of FIG. 6A.

Referring to FIGS. 2 and 3, a source structure SC and an electrode structure ST may be disposed on a substrate 10. The substrate 10 may be a semiconductor substrate, e.g., a silicon substrate, a germanium substrate, or a silicon-germanium substrate. A well region 10w may be disposed in the substrate 10, such that the well region 10w is a limited portion of the substrate 10. The substrate 10 may have a first conductivity type. The well region 10w may include an impurity of a second conductivity type different from the first conductivity type. For example, the first conductivity type may be a P-type, and the second conductivity type may be an N-type. In this case, the well region 10w may include an N-type impurity, e.g., phosphorus or arsenic. In some example embodiments, the well region 10w may be omitted.

The source structure SC may be interposed between the substrate 10 and the electrode structure ST and may be disposed on the well region 10w. The source structure SC and the electrode structure ST may be sequentially stacked on the substrate 10 in a first direction D1 that extends perpendicular to an upper surface 10U of the substrate 10. As shown in at least FIGS. 2-3, the electrode structure ST may extend in a second direction D2 parallel to the upper surface 10U of the substrate 10. The source structure SC may extend in the second direction D2 below the electrode structure ST. The source structure SC may include a first source conductive pattern SCP1 and a second source conductive pattern SCP2 that are sequentially stacked on the substrate 10, such that the first source conductive pattern SCP1 is between the substrate 10 and the electrode structure ST and the second source conductive pattern SCP2 is between the first source conductive pattern SCP1 and the electrode structure ST. Accordingly, it will be understood that the three-dimensional semiconductor memory device 100 may include a source conductive pattern (first source conductive pattern SCP1, second source conductive pattern SCP2, or both the first and second source conductive patterns SCP1 and SCP2) between the substrate 10 and the electrode structure ST. The first source conductive pattern SCP1 may directly contact the well region 10w. In some example embodiments, an insulation layer may be disposed between the first source conductive pattern SCP1 and the well region 10w. The first and second source conductive patterns SCP1 and SCP2 may include a semiconductor material doped with an impurity of the second conductivity type. A concentration of the impurity in the first source conductive pattern SCP1 may be greater than that in the second source conductive pattern SCP2. As an example, the first and second source conductive patterns SCP1 and SCP2 may include polysilicon doped with the N-type impurity e.g., phosphorus, or arsenic. A concentration of the N-type impurity may be greater in the first source conductive pattern SCP1 than in the second source conductive pattern SCP2.

As described herein, it will be understood that an element "on" another element may be above or below the other element, in relation to a reference element. In addition, an element that is "on" another element may be "directly on" (e.g., in contact with) the other element or may be "indirectly on" the other element (e.g., isolated from direct contact with the other element by an interposing element and/or space).

Referring to FIGS. 3 and 4, the first source conductive pattern SCP1 may have recessed sidewalls OP. Each of the recessed sidewalls OP may be concave toward the inside of the first source conductive pattern SCP1. The first source conductive pattern SCP1 may have at least a pair of recessed sidewalls OP opposite to each other in a third direction D3 crossing the second direction D2 and parallel to the upper surface 10U of the substrate 10. The second source conductive pattern SCP2 may cover an upper surface of the first source conductive pattern SCP1 and may extend on the recessed sidewalls OP. A portion of the second source conductive pattern SCP2 may cover the recessed sidewalls OP of the first source conductive pattern SCP1 and may contact the substrate 10 or an insulation layer 11 on the well region 10w. In some example embodiments, the insulation layer 11 may be omitted. In this case, the portion of the second source conductive pattern SCP2 may directly contact the substrate 10 or the well region 10w.

Referring again to FIGS. 2 and 3, the electrode structure ST may include a lower electrode structure LST, an upper electrode structure UST, and a planar insulation layer 50 between the lower electrode structure LST and the upper electrode structure UST. The lower electrode structure LST may include lower gate electrodes EGE and GGE and lower insulation layers 110a that are alternately stacked on the source structure SC along the first direction D1. The upper electrode structure UST may include upper gate electrodes CGE and SGE and upper insulation layers 110b that are alternately stacked on the planar insulation layer 50 along the first direction D1. Accordingly, and as shown in at least FIG. 3, the electrode structures ST may include gate electrodes (collectively the lower gate electrodes EGE and GGE and the upper gate electrodes CGE and SGE) that are sequentially stacked in a first direction D1 on the substrate 10. The planar insulation layer 50 may be interposed between an uppermost gate electrode GGE of the lower gate electrodes EGE and GGE and a lowermost gate electrode CGE of the upper gate electrodes CGE and SGE. Each of the lower insulation layers 110a, each of the upper insulation layers 110b, and the planar insulation layer 50 may have a thickness in the first direction D1. The thickness of the planar insulation layer 50 may be greater than that of each of the lower and upper insulation layers 110a and 110b. The lower and upper insulation layers 110a and 110b may have a substantially same thickness (e.g., the same thickness within manufacturing tolerances and/or material tolerances), or a portion of the lower and upper insulation layers 110a and 110b may be thicker than another portion of the lower and upper insulation layers 110a and 110b. As an example, an uppermost insulation layer 110b of the lower and upper insulation layers 110a and 110b may be thicker than the others of the lower and upper insulation layers 110a and 110b.

The lower gate electrodes EGE and GGE and the upper gate electrodes CGE and SEG may include doped semiconductor (e.g., doped silicon), metal (e.g., tungsten, copper, or aluminum), conductive metal nitride (e.g., titanium nitride or tantalum nitride), and/or transition metal (e.g., titanium or tantalum). The lower insulation layers 110a, the upper insulation layers 110b, and the planar insulation layer 50 may include silicon oxide and/or a low-k dielectric material.

Referring to FIGS. 2, 3, and 5, the lower gate electrodes EGE and GGE may include an erase control gate electrode EGE and a ground select gate electrode GGE on the erase gate electrode EGE. The erase control gate electrode EGE may be adjacent to the source structure SC. A lowermost one of the lower insulation layers 110a may be disposed between the erase control gate electrode EGE and the source structure SC. The erase control gate electrode EGE may be used as a gate electrode of the erase control transistor ECT for controlling the erase operation of the memory cell array shown in FIG. 1. The ground select gate electrode GGE may be used as a gate electrode of the ground select transistor GST shown in FIG. 1. The erase control gate electrode EGE and the ground select gate electrode GGE may extend in the second direction D2.

The upper gate electrodes CGE and SGE may include cell gate electrodes CGE and a string select gate electrode SGE. The cell gate electrodes CGE may be disposed between the ground select gate electrode GGE and the string select gate electrode SGE and may be positioned at different heights from the upper surface 10U of the substrate 10 in relation to each other. The cell gate electrodes CGE may be used as gate electrodes of the memory cell transistors MCT shown in FIG. 1. The cell gate electrodes CGE may extend in the second direction D2.

Referring to FIGS. 2 and 3, the string select gate electrode SGE may include a pair of string select gate electrodes SGE1 and SGE2 that are laterally spaced apart from each other in the third direction D3. The pair of string select gate electrodes SGE1 and SGE2 may be separated from each other by a separation insulation pattern 105 therebetween. The separation insulation pattern 105 may have a linear shape extending in the second direction D2. The separation insulation pattern 105 may include an insulation material, e.g., silicon oxide. The string select gate electrode SGE may be used as a gate electrode of the string select transistor SST2 shown in FIG. 1. In some example embodiments, an additional string select gate electrode SGE may be disposed between the string select gate electrode SGE and an uppermost gate electrode of the cell gate electrodes CGE. In this case, the additional string select gate electrode SGE may include a pair of additional string select gate electrodes SGE1 and SGE2 spaced apart from each other in the third direction D3, and the additional string select gate electrode SGE and the string select gate electrode SGE may be used as gate electrodes of the string selection transistors SST1 and SST2.

The vertical semiconductor patterns VS may be disposed on the substrate 10. Each of the vertical semiconductor patterns VS may extend in the first direction D1 to penetrate the electrode structure ST and the source structure SC. A lower end portion of each of the vertical semiconductor patterns VS may be disposed in the substrate 10 or the well region 10w. The vertical semiconductor patterns VS may be arranged in a direction or in a zigzag form, in plan view. Each of the vertical semiconductor patterns VS may have a pipe shape or a macaroni shape, of which a lower end is closed. The vertical semiconductor patterns VS may include a semiconductor material, e.g., silicon, germanium, or a compound thereof. The vertical semiconductor patterns VS may include an impurity-doped semiconductor material or an intrinsic semiconductor material that is not doped with an impurity. The vertical semiconductor patterns VS may include a polycrystalline semiconductor material. The vertical semiconductor patterns VS may be used as channels of the erase control transistor ECT, the string and ground select transistors SST and GST, and the memory cell transistors MCT shown in FIG. 1.

A lower sidewall of each of the vertical semiconductor patterns VS may contact the first source conductive pattern SCP1.

Referring to FIG. 6A, the first source conductive pattern SCP1 may include a horizontal portion HP extending substantially parallel (e.g., parallel within manufacturing tolerances and/or material tolerances) to the upper surface 10U of the substrate 10 in the second direction D2 on the substrate 10 (e.g., below the electrode structure ST in relation to the substrate 10) and a vertical portion SP protruding ("extending") from the horizontal portion HP in the first direction D1. The vertical portion SP of the first source conductive pattern SCP1 may contact a portion of a sidewall of each of the vertical semiconductor patterns VS and may surround and/or cover the portion of the sidewall of each of the vertical semiconductor patterns VS. The horizontal portion HP of the first source conductive pattern SCP1 may be interposed between the upper surface 10U of the substrate 10 and the second source conductive pattern SCP2. The horizontal portion HP of the first source conductive pattern SCP1 may contact the substrate 10 or the well region 10w. The vertical portion SP of the first source conductive pattern SCP1 may extend between the sidewall of each of the vertical semiconductor patterns VS and the substrate 10 and between the sidewall of each of the vertical semiconductor patterns VS and the second source conductive pattern SCP2. The horizontal portion HP of the first source conductive pattern SCP1 may include at least one air-gap AG or a seam therein.

Referring again to FIGS. 2 and 3, the data storage pattern DSP may be interposed between each of the vertical semiconductor patterns VS and the electrode structure ST. The data storage pattern DSP may extend in the first direction D1 and may surround the sidewall of each of the vertical semiconductor patterns VS. The data storage pattern DSP may have a pipe shape or a macaroni shape, of which an upper end and a lower end are opened. As shown in at least FIG. 3, and as further shown in at least FIGS. 6A-6B, a lower surface DSP_L of the data storage pattern DSP may contact the first source conductive pattern SCP1.

Referring to FIGS. 6A and 6B, the lower surface DSP_L of the data storage pattern DSP may be positioned at a height lower than (e.g., proximate to the upper surface 10U of the substrate 10 in relation to) a lower surface EGE_L of the erase control gate electrode EGE and may contact the vertical portion SP of the first source conductive pattern SCP1. As used herein, the term "height" means a distance measured from the upper surface 10U of the substrate 10. In some example embodiments, a lower portion of the data storage pattern DSP may be interposed between the sidewall of each of the vertical semiconductor patterns VS and the second source conductive pattern SCP2. The lower surface DSP_L of the data storage pattern DSP may be positioned at a height higher than ("distal from the upper surface 10U of the substrate 10 in relation to") an upper surface HP_U of the horizontal portion HP of the first source conductive pattern SCP1.

The data storage pattern DSP may be a data storage layer of a NAND flash memory device. The data storage pattern DSP may include a first insulation pattern 210 between each of the vertical semiconductor patterns VS and the electrode structure ST, a second insulation pattern 200 between the first insulation pattern 210 and the electrode structure ST, and a third insulation pattern 220 between each of the vertical semiconductor patterns VS and the first insulation pattern 210. The first insulation pattern 210 may be a charge storage layer, e.g., a trap insulation layer, an insulation layer including conductive nano dots, or a floating gate electrode. As an example, the first insulation pattern 210 may include at least one of silicon nitride, silicon oxynitride, silicon-rich nitride, nanocrystalline silicon, and a laminated trap layer. The second insulation pattern 200 may include a material having a band gap greater than the first insulation pattern 210. Accordingly, the second insulation pattern 200 may include a different material from the first insulation pattern 210. The second insulation pattern 200 may be a blocking layer and may include a high-k dielectric material, e.g., aluminum oxide or hafnium oxide. The third insulation pattern 220 may include a material having a band gap greater than the first insulation pattern 210. The third insulation pattern 220 may be a tunnel insulation layer and may include, e.g., silicon oxide.

A portion of the lower surface DSP_L of the data storage pattern DSP may be positioned at a different height from the upper surface 10U of the substrate 10 in relation to another portion of the lower surface DSP_L of the data storage pattern DSP, with respect to the upper surface 10U of the substrate 10. As shown in at least FIGS. 6A-6B, a lower surface 200L of the second insulation pattern 200 may be positioned at a different height from the upper surface 10U of the substrate 10 in relation to a lower surface 210L of the first insulation pattern 210. In some example embodiments, including the example embodiments shown in at least FIG. 6B, the lower surface 200L of the second insulation pattern 200 may be positioned at a height higher than ("may be distal from the upper surface 10U of the substrate 10 in relation to") the lower surface 210L of the first insulation pattern 210. A lower surface 220L of the third insulation pattern 220 may be positioned at a different height from the upper surface 10U of the substrate 10 in relation to the lower surface 210L of the first insulation pattern 210. In some example embodiments, the lower surface 220L of the third insulation pattern 220 may be positioned at a height lower than ("may be proximate to the upper surface 10U of the substrate 10 in relation to") the lower surface 210L of the first insulation pattern 210. The lower surface 220L of the third insulation pattern 220 and the lower surface 210L of the first insulation pattern 210 may be aligned with each other while being sloped with respect to the upper surface 10U of the substrate 10.

The lower surfaces 210L, 200L, and 220L of the first to third insulation patterns 210, 200, and 220 may contact the vertical portion SP of the first source conductive pattern SCP1. The vertical portion SP of the first source conductive pattern SCP1 may have a width SP_W in a vertical extension direction (e.g., the first direction D1) of the sidewall of each of the vertical semiconductor patterns VS. The width SP_W of the vertical portion SP of the first source conductive pattern SCP1 may increase in a direction away from the sidewall of each of the vertical semiconductor patterns VS.

Referring to FIGS. 2, 3, and 6A, a dummy data storage pattern DSPr may be disposed between each of the vertical semiconductor patterns VS and the substrate 10 or the well region 10w. The dummy data storage pattern DSPr may be disposed in the substrate 10 or the well region 10w. Each of the vertical semiconductor patterns VS may be spaced apart from ("isolated from direct contact with") the substrate 10 or the well region 10w by the dummy data storage pattern DSPr. The dummy data storage pattern DSPr may be disposed between a lower surface of each of the vertical semiconductor patterns VS and the substrate 10 or the well region 10w and may extend onto the sidewall of each of the vertical semiconductor patterns VS. The dummy data storage pattern DSPr may have a U-shaped cross-section. The data storage pattern DSP may be spaced apart from ("isolated from direct contact with") the dummy data storage pattern DSPr in the first direction D1 with the source structure SC therebetween.

An uppermost surface of the dummy data storage pattern DSPr may be lower than the upper surface 10U of the substrate 10. The dummy data storage pattern DSPr may be vertically spaced apart from the data storage pattern DSP with the vertical portion SP of the first source conductive pattern SCP1 therebetween. As shown in at least FIG. 6A, the uppermost surface of the dummy data storage pattern DSPr may contact the vertical portion SP of the first source conductive pattern SCP1. The dummy data storage pattern DSPr may have substantially the same multilayered structure (e.g., the same multilayered structure within manufacturing tolerances and/or material tolerances) as the data storage pattern DSP. For example, the dummy data storage pattern DSPr may include a first dummy insulation pattern 210r between each of the vertical semiconductor patterns VS and the substrate 10 or the well region 10w, a second dummy insulation pattern 200r between the first dummy insulation pattern 210r and the substrate 10 or the well region 10w, and a third dummy insulation pattern 220r between the first dummy insulation pattern 210r and each of the vertical patterns VS. The first dummy insulation pattern 210r, the second dummy insulation pattern 200r, and the third dummy insulation pattern 220r may respectively include the same material as the first insulation pattern 210, the second insulation pattern 200, and the third insulation pattern 220, such that the dummy data storage pattern DSPr and the data storage pattern DSP include a same ("common") material.

Referring again to FIGS. 2 and 3, a buried insulation pattern 160 may fill the inside of each of the vertical semiconductor patterns VS. The buried insulation pattern 160 may include, e.g., silicon oxide. A conductive pad 150 may be disposed on each of the vertical semiconductor patterns VS. The conductive pad 150 may cover an upper surface of the buried insulation pattern 160 and an uppermost surface of each of the vertical semiconductor patterns VS. The conductive pad 150 may include an impurity-doped semiconductor material and/or a conductive material. The data storage pattern DSP may extend from the sidewall of each of the vertical semiconductor patterns VS to a sidewall of the conductive pad 150. The data storage pattern DSP may surround the sidewall of the conductive pad 150. The uppermost surface of the data storage pattern DSP may be substantially coplanar (e.g., coplanar within manufacturing tolerances and/or material tolerances) with an upper surface of the conductive pad 150.

Common source plugs CSP may be disposed at opposite sides, respectively, of the electrode structure ST and may be connected to the substrate 10 or the well region 10w. The common source plugs CSP may extend in the second direction D2 and may be spaced apart from each other in the third direction D3 with the electrode structure ST therebetween. The common source plugs CSP may be isolated from direct contact with the vertical semiconductor pattern VS.

The common source plugs CSP may be disposed at opposite sides, respectively, of the source structure SC and may be spaced apart from each other with the source structure SC in the third direction D3. In some example embodiments, the electrode structure ST may be disposed between adjacent common source regions. The common source regions may be disposed in the substrate 10 at the opposite sides, respectively, of the electrode structure ST and may extend in the second direction D2. In this case, the common source plugs CSP may be disposed at the opposite sides, respectively, of the electrode structure ST and may be connected to the common source regions, respectively. Sidewall insulation spacers SS may be disposed at the opposite sides, respectively, of the electrode structure ST. Each of the sidewall insulation spacers SS may be disposed between each of the common source plugs CSP and the electrode structure ST. Each of the sidewall insulation spacers SS may extend between each of the common source plugs CSP and the source structure SC and may contact the substrate 10 or the well region 10w. The common source plugs CSP may include a conductive material. The sidewall insulation spacers SS may include, e.g., silicon nitride.

A capping insulation layer 120 may be disposed on the electrode structure ST and may cover an upper surface of the electrode structure ST and the upper surface of the conductive pad 150. An upper surface of the capping insulation layer 120 may be substantially coplanar (e.g., coplanar within manufacturing tolerances and/or material tolerances) with upper surfaces of the common source plugs CSP. An interlayer insulation layer 130 may be disposed on the capping insulation layer 120 to cover the upper surfaces of the common source plugs CSP. The capping insulation layer 120 and the interlayer insulation layer 130 may include an insulation material, e.g., silicon oxide. A first contact 125 may be disposed on the conductive pad 150. The first contact 125 may penetrate the capping insulation layer 120 to be connected to the conductive pad 150. A second contact 135 may penetrate the interlayer insulation layer 130 to be connected to the first contact 125. The first contact 125 and the second contact 135 may include a conductive material. Bit lines BL may be disposed on the interlayer insulation layer 130. The bit lines BL may extend in the third direction D3 and may be spaced apart from each other in the second direction D2. The vertical semiconductor patterns VS may include a dummy vertical semiconductor pattern DVS unconnected to the first contact 125 or the second contact 135. Each of the vertical semiconductor patterns VS except for the dummy vertical semiconductor pattern DVS may be electrically connected to a corresponding one of the bit lines BL through the first contact 125 and the second contact 135. The bit lines BL may include a conductive material. Referring to FIG. 1, as the erase voltage is applied to the source structure SC during the erase operation of the memory cell array, the gate induced drain leakage (GIDL) current may be generated in the erase control transistor ECT. Thus, the erase operation may be performed on the memory cells.

Figure 7A:
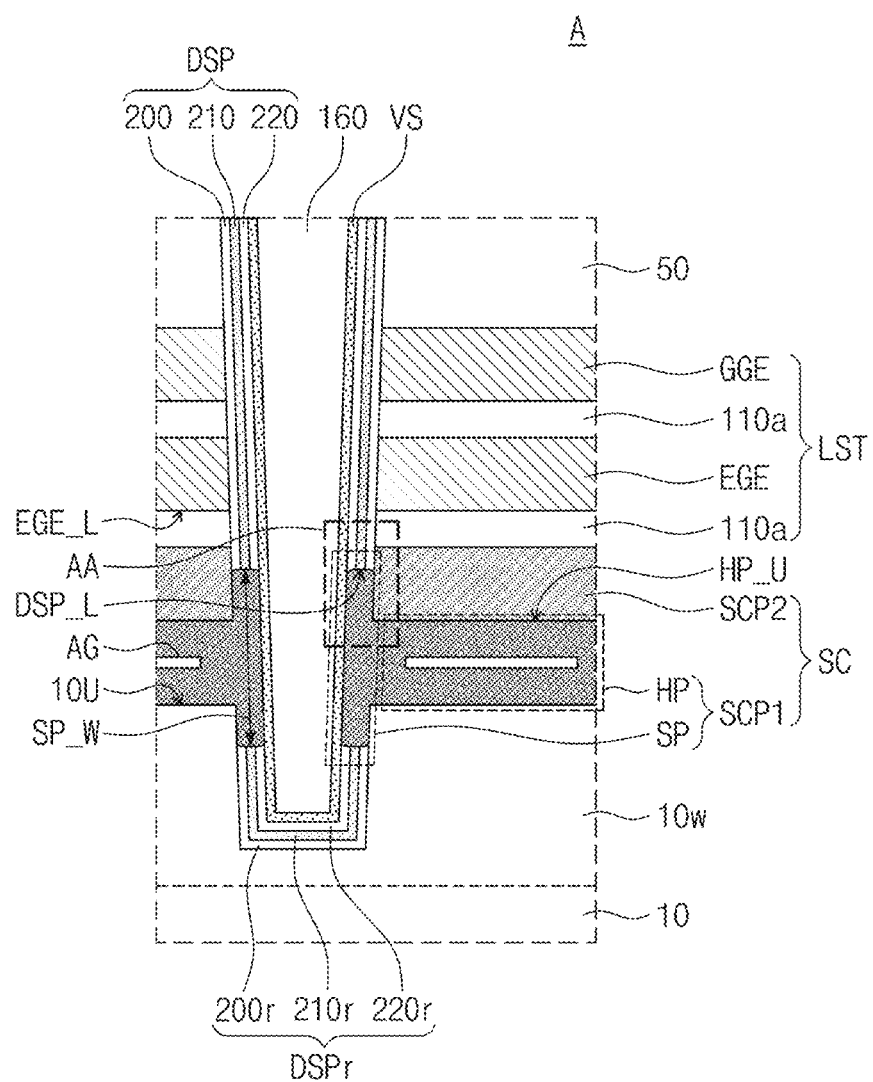
FIGS. 7A, 8A, 9A, and 10A are cross-sectional views illustrating a part of a three-dimensional semiconductor memory device according to some example embodiments and are enlarged views corresponding to portion A of FIG. 3.
Figure 7B:
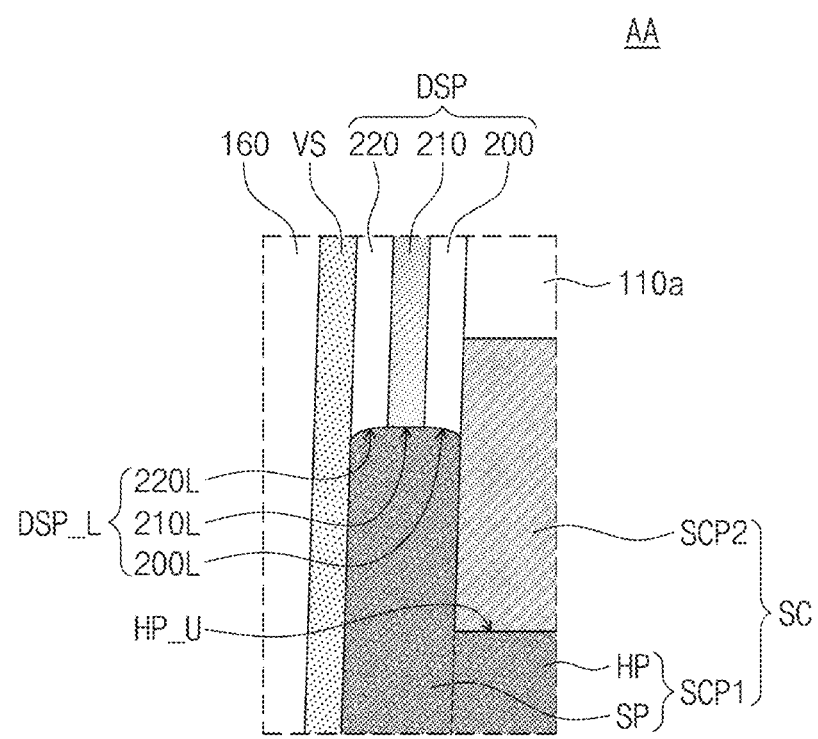
FIGS. 7B, 8B, 9B, and 10B are enlarged views of portion AA of FIG. 7A, 8A, 9A, an 10A, respectively.

FIG. 7A is a cross-sectional view illustrating a part of a three-dimensional semiconductor memory device 100 according to some example embodiments and is an enlarged view corresponding to portion A of FIG. 3. FIG. 7B is an enlarged view of portion AA of FIG. 7A. Differences between the example embodiments shown in FIGS. 7A-7B and the aforementioned example embodiments are mainly described hereinafter.

Referring to FIGS. 7A and 7B, the lower surface DSP_L of the data storage pattern DSP may be positioned at a height lower than ("proximate to the upper surface 10U of the substrate 10 in relation to") the lower surface EGE_L of the erase control gate electrode EGE (and thus may be proximate to the upper surface 10U of the substrate 10 in relation to a lower surface of a lowermost gate electrode of the gate electrodes (EGE, GGE, CGE, SGE)) and may contact the vertical portion SP of the first source conductive pattern SCP1. The lower surface DSP_L of the data storage pattern DSP may be positioned at a height higher than an upper surface HP_U of the horizontal portion HP of the first source conductive pattern SCP1.

The lower surface DSP_L of the data storage pattern DSP may be substantially parallel (e.g., parallel within manufacturing tolerances and/or material tolerances) to the upper surface 10U of the substrate 10. The lower surface DSP_L of the data storage pattern DSP may be flat or substantially flat (e.g., flat within manufacturing tolerances and/or material tolerances). The lower surface 210L of the first insulation pattern 210, the lower surface 200L of the second insulation pattern 200, and the lower surface 220L of the third insulation pattern 220 may be positioned at substantially the same height (e.g., the same height within manufacturing tolerances and/or material tolerances) from the upper surface 10U of the substrate 10. The lower surfaces 210L, 200L, and 220L of the first to third insulation patterns 210, 200, and 220 may contact the vertical portion SP of the first source conductive pattern SCP1. The vertical portion SP of the first source conductive pattern SCP1 may have the width SP_W in the extension direction (e.g., the first direction D1) of the sidewall of each of the vertical semiconductor patterns VS. The width SP_W of the vertical portion SP of the first source conductive pattern SCP1 may be substantially constant (e.g., constant within manufacturing tolerances and/or material tolerances) in a direction away from the sidewall of each of the vertical semiconductor patterns VS.

Figure 8A:
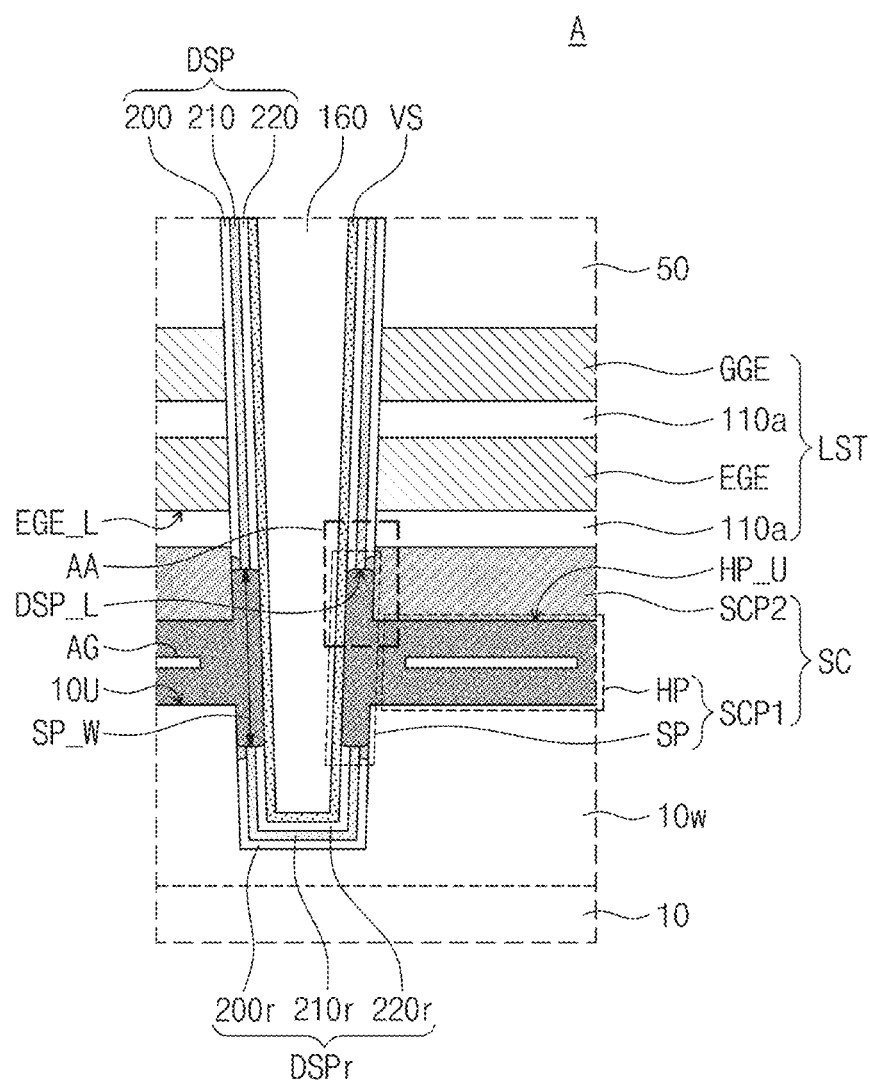
Figure 8B:
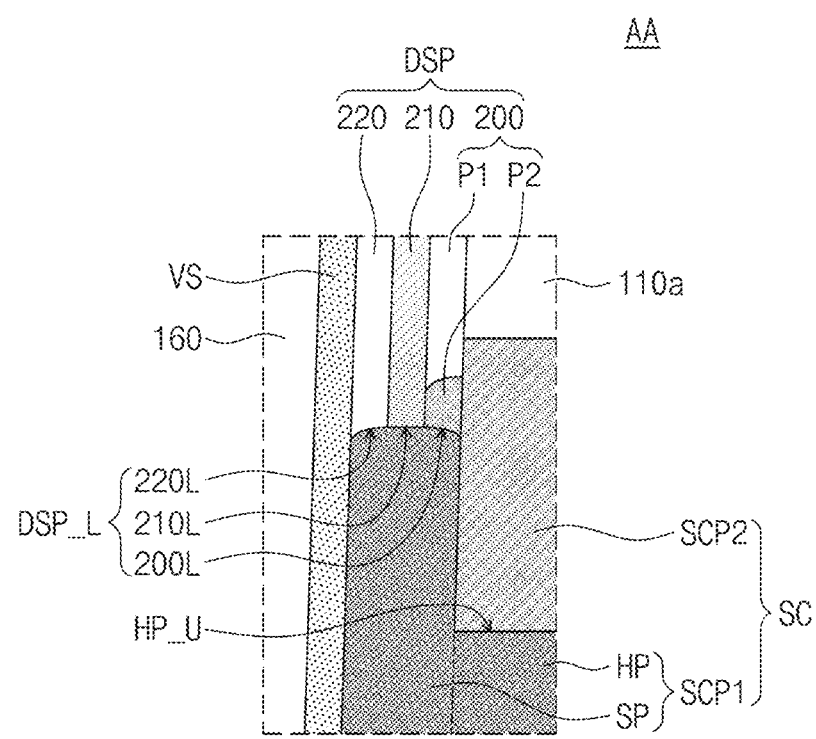

FIG. 8A is a cross-sectional view illustrating a part of a three-dimensional semiconductor memory device 100 according to some example embodiments and is an enlarged view corresponding to portion A of FIG. 3. FIG. 8B is an enlarged view of portion AA of FIG. 8A. Differences between the example embodiments shown in FIGS. 8A-8B and the aforementioned example embodiments are mainly described hereinafter.

Referring to FIGS. 8A and 8B, the lower surface DSP_L of the data storage pattern DSP may be positioned at a height lower than the lower surface EGE_L of the erase control gate electrode EGE and may contact the vertical portion SP of the first source conductive pattern SCP1. The lower surface DSP_L of the data storage pattern DSP may be positioned at a height higher than the upper surface HP_U of the horizontal portion HP of the first source conductive pattern SCP1.

The data storage pattern DSP may include the first insulation pattern 210, the second insulation pattern 200, and the third insulation pattern 220. The second insulation pattern 200 may include a first portion P1 and a second portion P2 between the first portion P1 and the first source conductive pattern SCP1. The second portion P2 of the second insulation pattern 200 may contact the vertical portion SP of the first source conductive pattern SCP1. As an example, the second portion P2 of the second insulation pattern 200 may include a different material from the first portion P1 of the second insulation pattern 200. As another example, the second portion P2 of the second insulation pattern 200 may include the same material as the first portion P1 of the second insulation pattern 200 and may include a material less dense than a material of the first portion P1 of the second insulation pattern 200. The second portion P2 of the second insulation pattern 200 may include, e.g., silicon oxide.

The lower surface DSP_L of the data storage pattern DSP may be substantially parallel (e.g., parallel within manufacturing tolerances and/or material tolerances) to the upper surface 10U of the substrate 10. The lower surface DSP_L of the data storage pattern DSP may be substantially flat (e.g., flat within manufacturing tolerances and/or material tolerances). The lower surface 210L of the first insulation pattern 210, the lower surface 200L of the second insulation pattern 200, and the lower surface 220L of the third insulation pattern 220 may be positioned at substantially the same height (e.g., the same height within manufacturing tolerances and/or material tolerances) from the upper surface 10U of the substrate 10. The lower surface 200L of the second insulation pattern 200 may correspond to a lower surface of the second portion P2 of the second insulation pattern 200. The lower surfaces 210L, 200L, and 220L of the first to third insulation patterns 210, 200, and 220 may contact the vertical portion SP of the first source conductive pattern SCP1. The vertical portion SP of the first source conductive pattern SCP1 may have the width SP_W in the extension direction (e.g., the first direction D1) of the sidewall of each of the vertical semiconductor patterns VS. The width SP_W of the vertical portion SP of the first source conductive pattern SCP1 may be substantially constant (e.g., constant within manufacturing tolerances and/or material tolerances) in a direction away from the sidewall of each of the vertical semiconductor patterns VS.

Figure 9A:
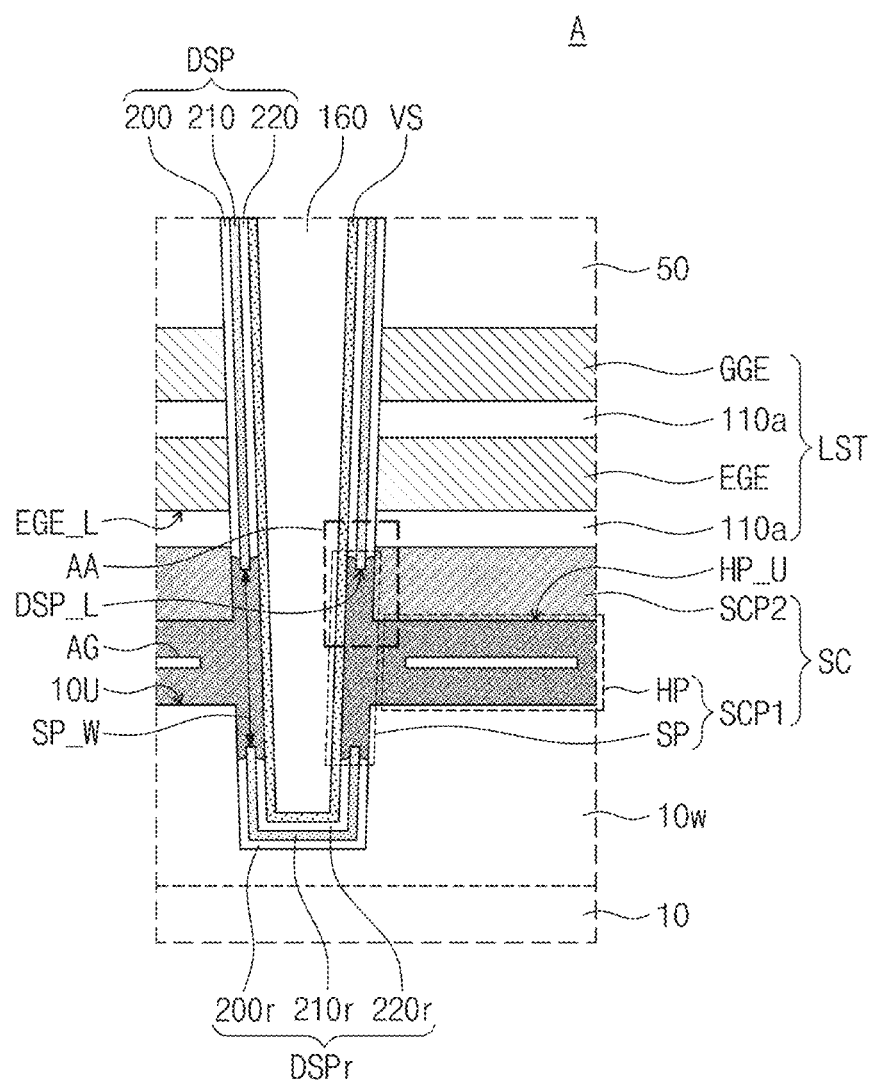
Figure 9B:
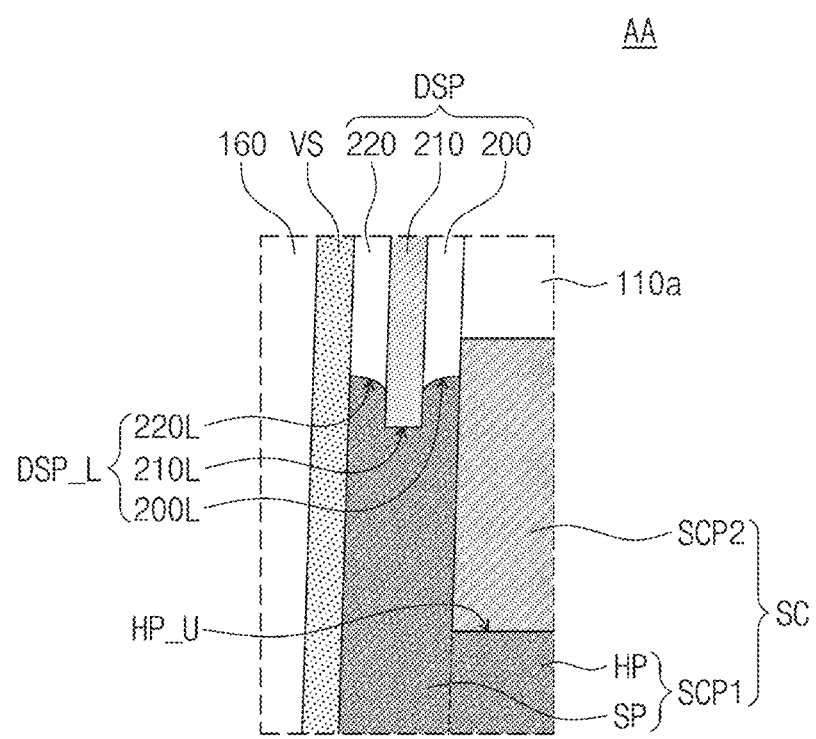

FIG. 9A is a cross-sectional view illustrating a part of a three-dimensional semiconductor memory device 100 according to some example embodiments and is an enlarged view corresponding to portion A of FIG. 3. FIG. 9B is an enlarged view of portion AA of FIG. 9A. Differences between the example embodiments shown in FIGS. 9A-9B and the aforementioned example embodiments are mainly described hereinafter.

Referring to FIGS. 9A and 9B, the lower surface DSP_L of the data storage pattern DSP may be positioned at a height lower than the lower surface EGE_L of the erase control gate electrode EGE and may contact the vertical portion SP of the first source conductive pattern SCP1. The lower surface DSP_L of the data storage pattern DSP may be positioned at a height higher than the upper surface HP_U of the horizontal portion HP of the first source conductive pattern SCP1.

A portion of the lower surface DSP_L of the data storage pattern DSP may be positioned at a different height from another portion of the lower surface DSP_L of the data storage pattern DSP, with respect to the upper surface 10U of the substrate 10. The lower surface 200L of the second insulation pattern 200 may be positioned at a different height from the lower surface 210L of the first insulation pattern 210. For example, the lower surface 200L of the second insulation pattern 200 may be positioned at a height higher than ("distal from the upper surface 10U of the substrate 10 in relation to") the lower surface 210L of the first insulation pattern 210. The lower surface 220L of the third insulation pattern 220 may be positioned at a different height from the lower surface 210L of the first insulation pattern 210. For example, the lower surface 220L of the third insulation pattern 220 may be positioned at a height higher than ("distal from the upper surface 10U of the substrate 10 in relation to") the lower surface 210L of the first insulation pattern 210. Since, the lower surface 210L of the first insulation pattern 210 is positioned at the height lower than ("proximate to the upper surface 10U of the substrate 10 in relation to") the lower surfaces 200L and 220L of the second and third insulation patterns 200 and 220, the first insulation pattern 210 may protrude further than the second and third insulation patterns 200 and 220 toward the substrate 10.

The lower surfaces 210L, 200L, and 220L of the first to third insulation patterns 210, 200, and 220 may contact the vertical portion SP of the first source conductive pattern SCP1. The protrusion portion of the first insulation pattern 210 may be disposed in the vertical portion SP of the first source conductive pattern SCP1 and may be covered by the vertical portion SP of the first source conductive pattern SCP1. The vertical portion SP of the first source conductive pattern SCP1 may have the width SP_W in the extension direction (e.g., the first direction D1) of the sidewall of each of the vertical semiconductor patterns VS. The width SP_W of the vertical portion SP of the first source conductive pattern SCP1 may decrease and then increase in a direction away from the sidewall of each of the vertical semiconductor patterns VS.

Figure 10A:
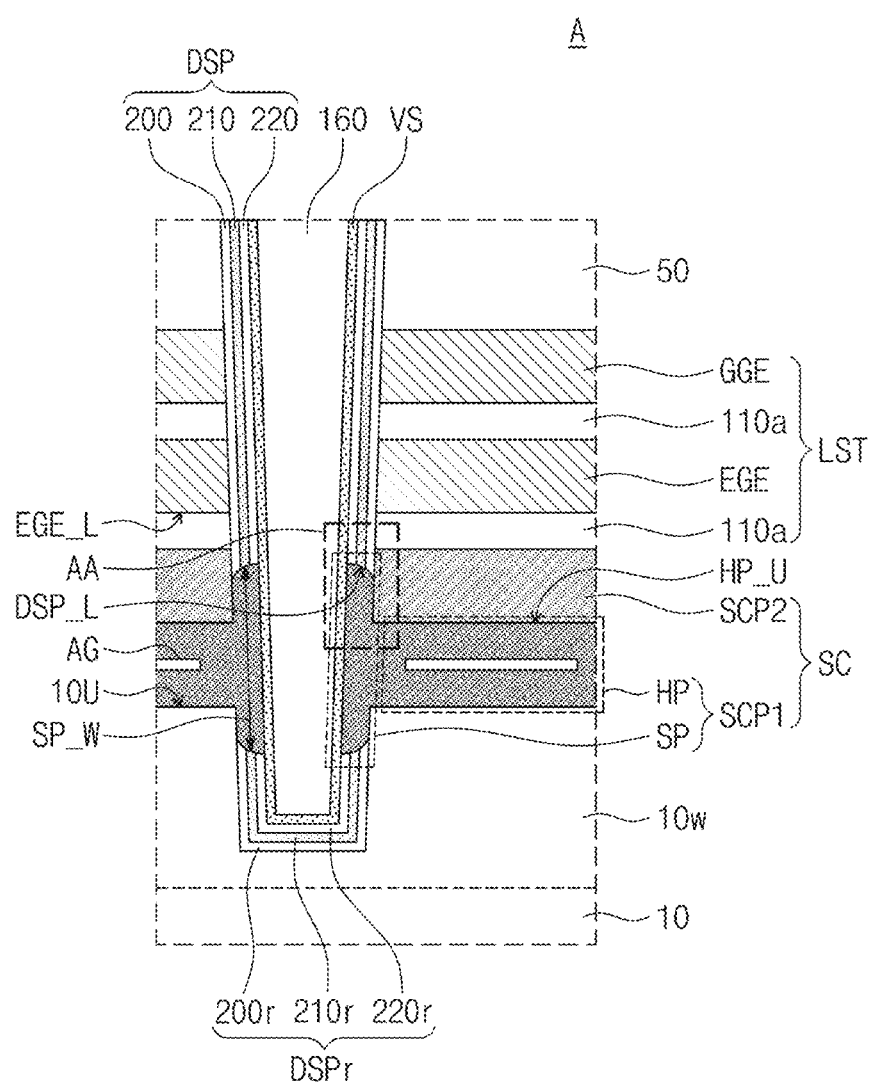
Figure 10B:
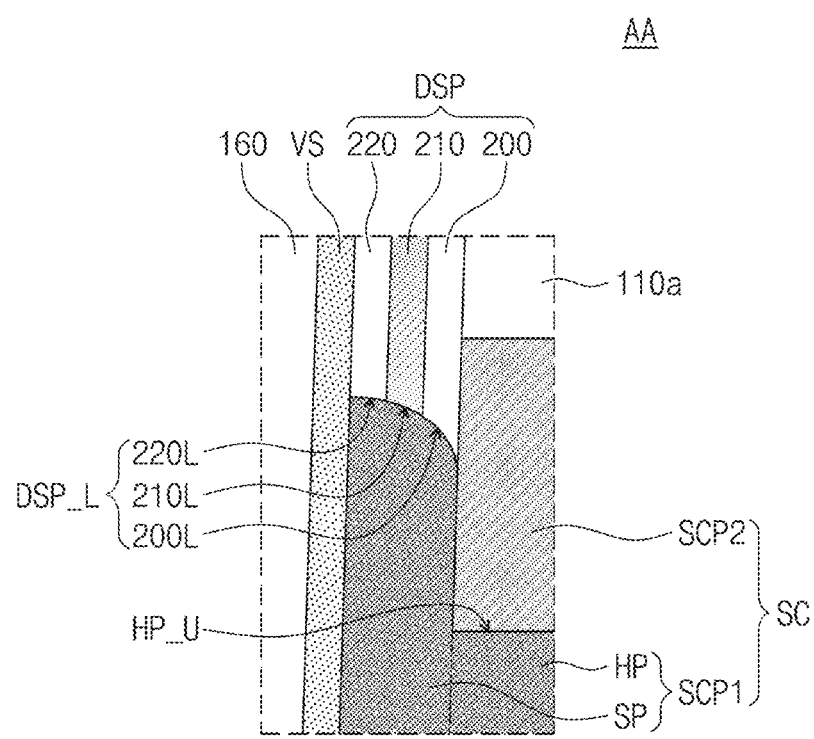

FIG. 10A is a cross-sectional view illustrating a part of a three-dimensional semiconductor memory device 100 according to some example embodiments and is an enlarged view corresponding to portion A of FIG. 3. FIG. 10B is an enlarged view of portion AA of FIG. 10A. Differences between the example embodiments shown in FIGS. 10A-10B and the aforementioned example embodiments are mainly described hereinafter.

Referring to FIGS. 10A and 10B, the lower surface DSP_L of the data storage pattern DSP may be positioned at a height lower than ("proximate to the upper surface 10U of the substrate 10 in relation to") the lower surface EGE_L of the erase control gate electrode EGE and may contact the vertical portion SP of the first source conductive pattern SCP1. The lower surface DSP_L of the data storage pattern DSP may be positioned at a height higher than the upper surface HP_U of the horizontal portion HP of the first source conductive pattern SCP1.

A portion of the lower surface DSP_L of the data storage pattern DSP may be positioned at a different height from another portion of the lower surface DSP_L of the data storage pattern DSP, with respect to the upper surface 10U of the substrate 10. The lower surface 200L of the second insulation pattern 200 may be positioned at a different height from the lower surface 210L of the first insulation pattern 210. For example, the lower surface 200L of the second insulation pattern 200 may be positioned at a height lower than ("proximate to the upper surface 10U of the substrate 10 in relation to") the lower surface 210L of the first insulation pattern 210. The lower surface 220L of the third insulation pattern 220 may be positioned at a different height from the lower surface 210L of the first insulation pattern 210. For example, the lower surface 220L of the third insulation pattern 220 may be positioned at a height higher than ("distal from to the upper surface 10U of the substrate 10 in relation to") the lower surface 210L of the first insulation pattern 210. The lower surfaces 210L, 200L, and 220L of the first to third insulation patterns 210, 200, and 220 may be aligned with each other while being sloped with respect to the upper surface 10U of the substrate 10.

The lower surfaces 210L, 200L, and 220L of the first to third insulation patterns 210, 200, and 220 may contact the vertical portion SP of the first source conductive pattern SCP1. The vertical portion SP of the first source conductive pattern SCP1 may have the width SP_W in the extension direction (e.g., the first direction D1) of the sidewall of each of the vertical semiconductor patterns VS. The width SP_W of the vertical portion SP of the first source conductive pattern SCP1 may decrease in a direction away from the sidewall of each of the vertical semiconductor patterns VS.

According to some example embodiments, the source structure SC and the electrode structure ST may be sequentially stacked on the substrate 10, and the vertical semiconductor pattern VS may penetrate the source structure SC and the electrode structure ST. The first source conductive pattern SCP1 of the source structure SC may directly contact the lower sidewall of the vertical semiconductor pattern VS. Thus, processes for electrically connecting between the vertical semiconductor pattern VS and the first source conductive pattern SCP1 may be omitted.

In addition, the first source conductive pattern SCP1 may include the vertical portion SP protruding in the first direction D1 from the horizontal portion HP, and the lower surface DSP_L of the data storage pattern DSP may contact the vertical portion HP of the first source conductive pattern SCP1. The profile of the lower surface DSP_L of the data storage pattern DSP may be variously changed such that a distance between the erase control gate electrode EGE and the first source conductive pattern SCP1 may be optimized. Accordingly, the gate induced drain leakage (GIDL) current may be optimized during the erase operation of the memory cell array, thus improving the operation characteristics of the three-dimensional semiconductor device.

FIGS. 11, 12, 13, 14, 15, 16, 17, 18, 19, 20, 21, and 22 are cross-sectional views taken along line I-I' of FIG. 2, illustrating a method of manufacturing a three-dimensional semiconductor memory device according to some example embodiments. FIGS. 23A, 23B, 23C, 24, 25A, 25B, 26A, 26B, and 27 are views illustrating a method of forming a data storage pattern of a three-dimensional semiconductor memory device and are enlarged views corresponding to portion B of FIG. 19.

Figure 11:
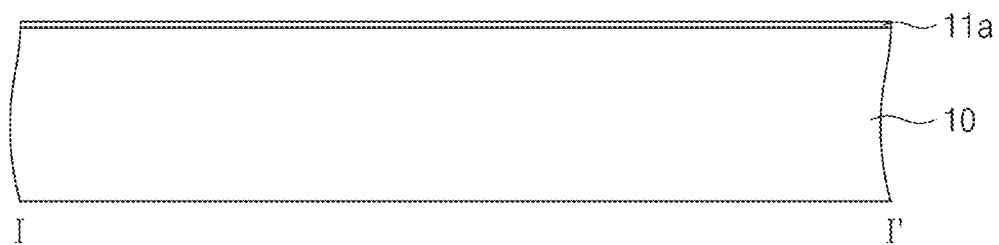
FIGS. 11, 12, 13, 14, 15, 16, 17, 18, 19, 20, 21, and 22 are cross-sectional views taken along line I-I' of FIG. 2, illustrating a method of manufacturing a three-dimensional semiconductor memory device according to some example embodiments.

Referring to FIGS. 2 and 11, an insulation layer 11a may be formed on the substrate 10. The substrate 10 may be a semiconductor substrate, e.g., a silicon substrate, a germanium substrate, or a silicon-germanium substrate. The insulation layer 11a may include, e.g., silicon oxide.

Figure 12:
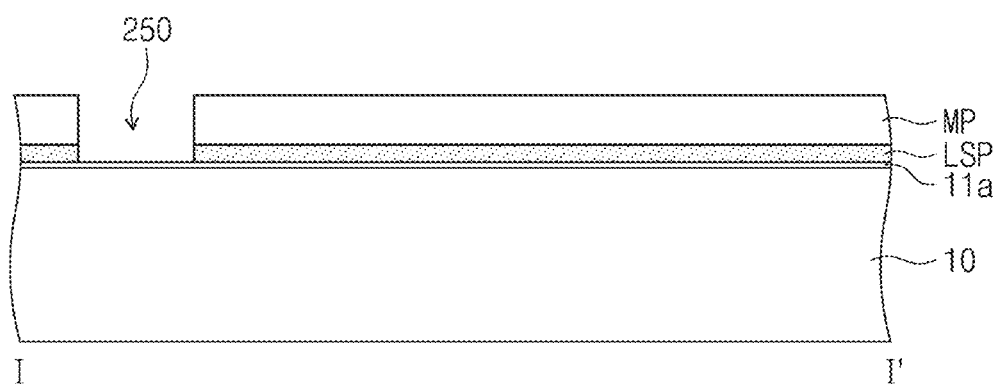

Referring to FIGS. 2 and 12, a lower sacrificial pattern LSP and a mask pattern MP may be sequentially formed on the insulation layer 11a. The lower sacrificial pattern LSP may be formed by forming a lower sacrificial layer on the insulation layer 11a, forming the mask pattern MP on the lower sacrificial layer, and etching the sacrificial layer using the mask pattern MP as an etch mask to expose the insulation layer 11a. By the etching process, the lower sacrificial pattern LSP may include an opening 250 exposing the insulation layer 11a. The lower sacrificial pattern LSP may include a material having an etch selectivity with respect to the insulation layer 11a. For example, the lower sacrificial pattern LSP may include at least one of silicon nitride, silicon oxynitride, silicon carbide, and silicon germanium.

Figure 13:
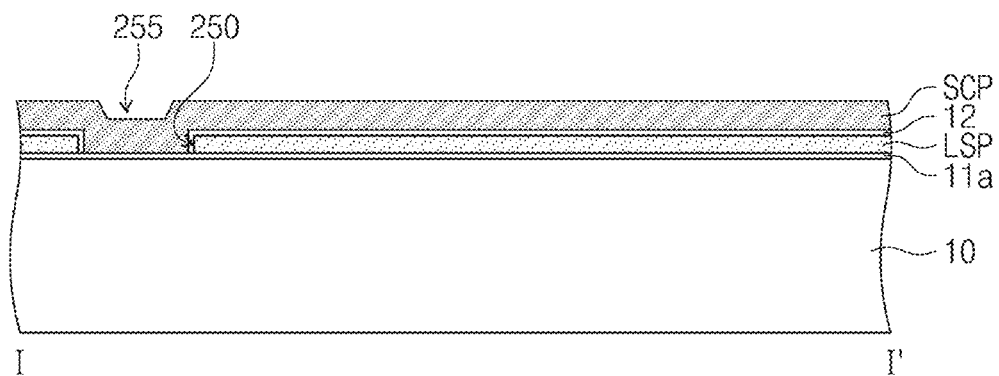

Referring to FIGS. 2 and 13, after forming the lower sacrificial pattern LSP, the mask pattern MP may be removed. Thereafter, a buffer insulation layer 12 and a source conductive layer SCP may be sequentially formed on the sacrificial pattern LSP. The buffer insulation layer 12 may be formed to cover an upper surface of the lower sacrificial pattern LSP and a sidewall of the lower sacrificial pattern LSP exposed by the opening 250 with a uniform thickness. The source conductive layer SCP may be formed to cover the upper surface of the lower sacrificial pattern LSP and an inner surface of the opening 250 with a uniform thickness. Thus, an upper surface of the source conductive layer SCP may include a surface 255 recessed toward the opening 250. The buffer insulation layer 12 may include, e.g., silicon oxide. The source conductive layer SCP may include, e.g., a polysilicon layer doped with the N-type impurity.

Figure 14:
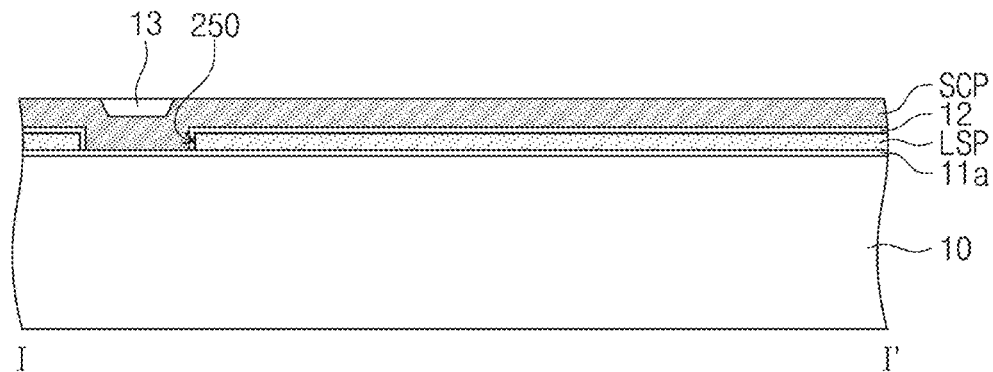

Referring to FIGS. 2 and 14, a separation layer 13 may be formed to cover the recessed surface 255 of the source conductive layer SCP. The formation of the separation layer 13 may include forming the separation layer 13 on the source conductive layer SCP and planarizing the separation layer 13 to expose the upper surface of the source conductive layer SCP. The separation layer 13 may include, e.g., silicon oxide.

Figure 15:
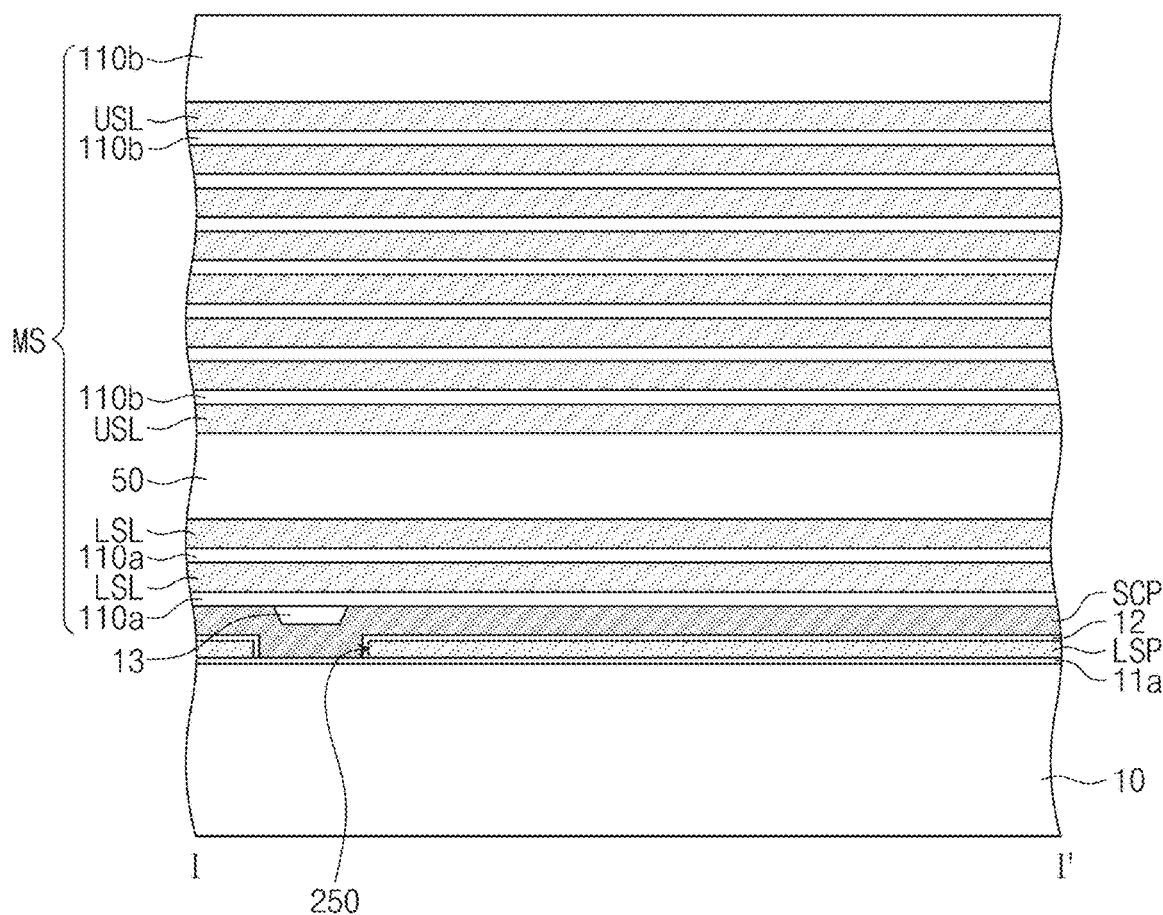

Referring to FIGS. 2 and 15, the lower insulation layers 110a and lower sacrificial layers LSL may be alternately stacked on the source conductive layer SCP. The lower sacrificial layers LSL may include a material having an etch selectivity with respect to the lower insulation layers 110a. In some example embodiments, the lower sacrificial layers LSL may include the same material as the lower sacrificial pattern LSP. The planar insulation layer 50 may be formed on an uppermost one of the lower sacrificial layers LSL. The planar insulation layer 50 may be formed with a thickness greater than each of the lower insulation layers 110a and may include, e.g., silicon oxide. The upper insulation layers 110b and upper sacrificial layers USL may be alternately stacked on the planar insulation layer 50. The upper sacrificial layers USL may include a material having an etch selectivity with respect to the upper insulation layers 110b. In some example embodiments, the upper sacrificial layers USL may include the same material as the lower sacrificial layers LSL and the lower sacrificial pattern LSP. As an example, the upper and lower sacrificial layers USL and LSL may include silicon nitride, and the upper and lower insulation layers 110b and 110a may include silicon oxide. The upper and lower sacrificial layers USL and LSL, the upper and lower insulation layers 110b and 110a, and the planar insulation layer 50 may constitute a mold structure MS.

Figure 16:
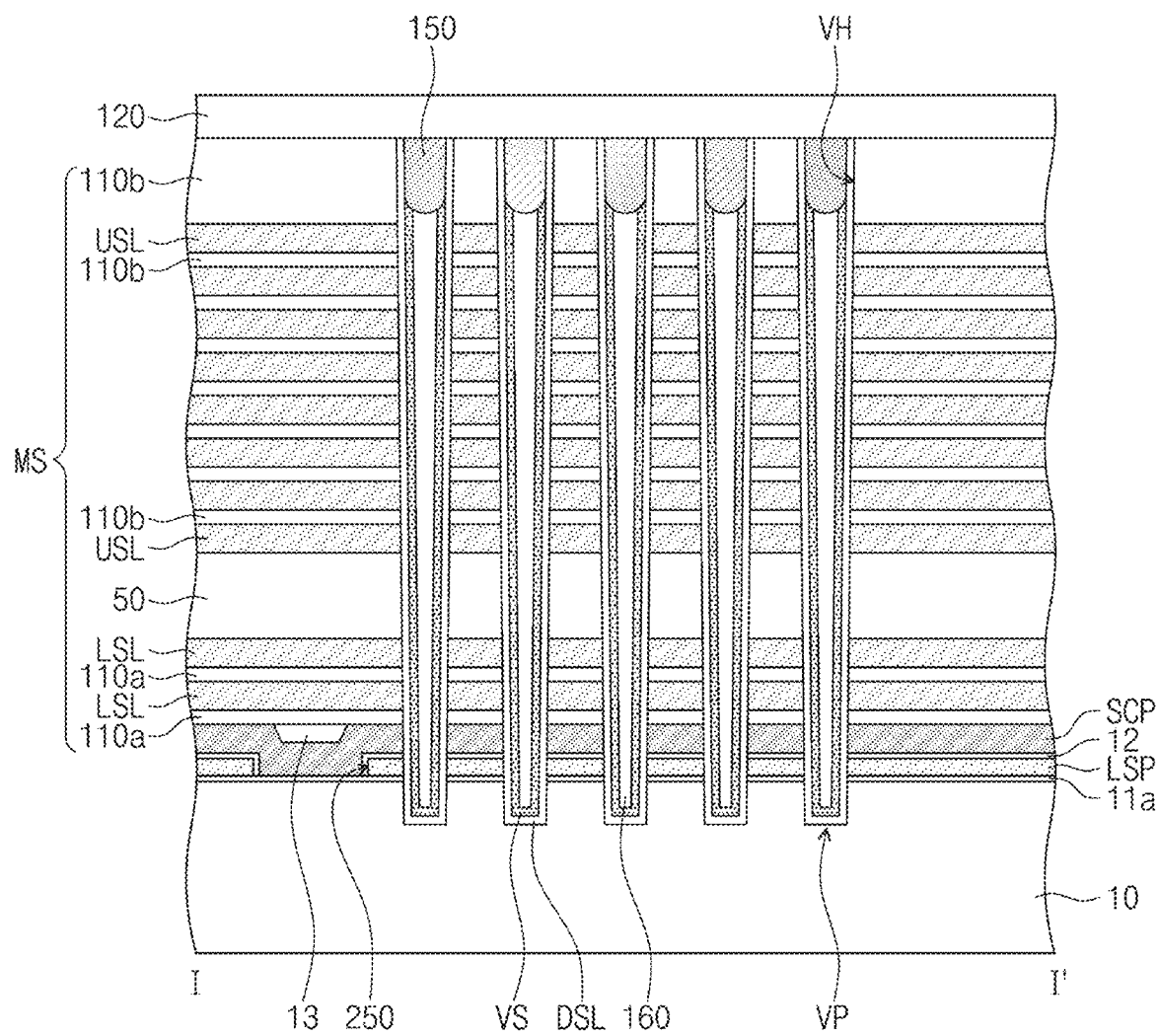

Referring to FIGS. 2 and 16, the separation insulation pattern 105 may be formed in the mold structure MS. The separation insulation pattern 105 may separate an uppermost one of the upper sacrificial layers USL. For example, the uppermost upper sacrificial layer USL may be separated into a pair of upper sacrificial layers USL laterally spaced apart from each other by the separation insulation pattern 105. Thereafter, the vertical structure VP may be formed to penetrate the mold structure MS, the source conductive layer SCP, the buffer insulation layer 12, the lower sacrificial pattern LSP, and the insulation layer 11a. The formation of the vertical structure VP may include forming a vertical hole VH penetrating the mold structure MS, the source conductive layer SCP, the buffer insulation layer 12, the lower sacrificial pattern LSP, and the insulation layer 11a to expose the substrate 10 and sequentially forming a data storage layer DSL and the vertical semiconductor pattern VS in the vertical hole VH. The data storage layer DSL and the vertical semiconductor pattern VS may fill a portion of the vertical hole VH and may cover an inner surface of the vertical hole VH with a uniform thickness. The formation of the vertical structure VP may further include forming the buried insulation pattern 160 to fill a remaining portion of the vertical hole VH after forming the data storage layer DSL and the vertical semiconductor pattern VS.

The data storage layer DSL may include a blocking insulation layer, a charge storage layer, and a tunnel insulation layer that are sequentially stacked on the inner surface of the vertical hole VH. The vertical semiconductor pattern VS may be formed by depositing a semiconductor layer with a uniform thickness on the data storage layer DSL using chemical vapor deposition or atomic layer deposition and then performing a planarization process to expose an upper surface of the mold structure MS. The vertical semiconductor pattern VS may include an impurity-doped semiconductor material or an intrinsic semiconductor material that is not doped with an impurity. The formation of the vertical structure VP may further include forming the conductive pad 150 on an upper end of the vertical semiconductor pattern VS. A lower surface of the conductive pad 150 may be positioned higher than an upper surface of the uppermost upper sacrificial layer USL. After forming the conductive pad 150, the capping insulation layer 120 may be formed on the mold structure MS to cover an upper surface of the conductive pad 150.

Figure 17:
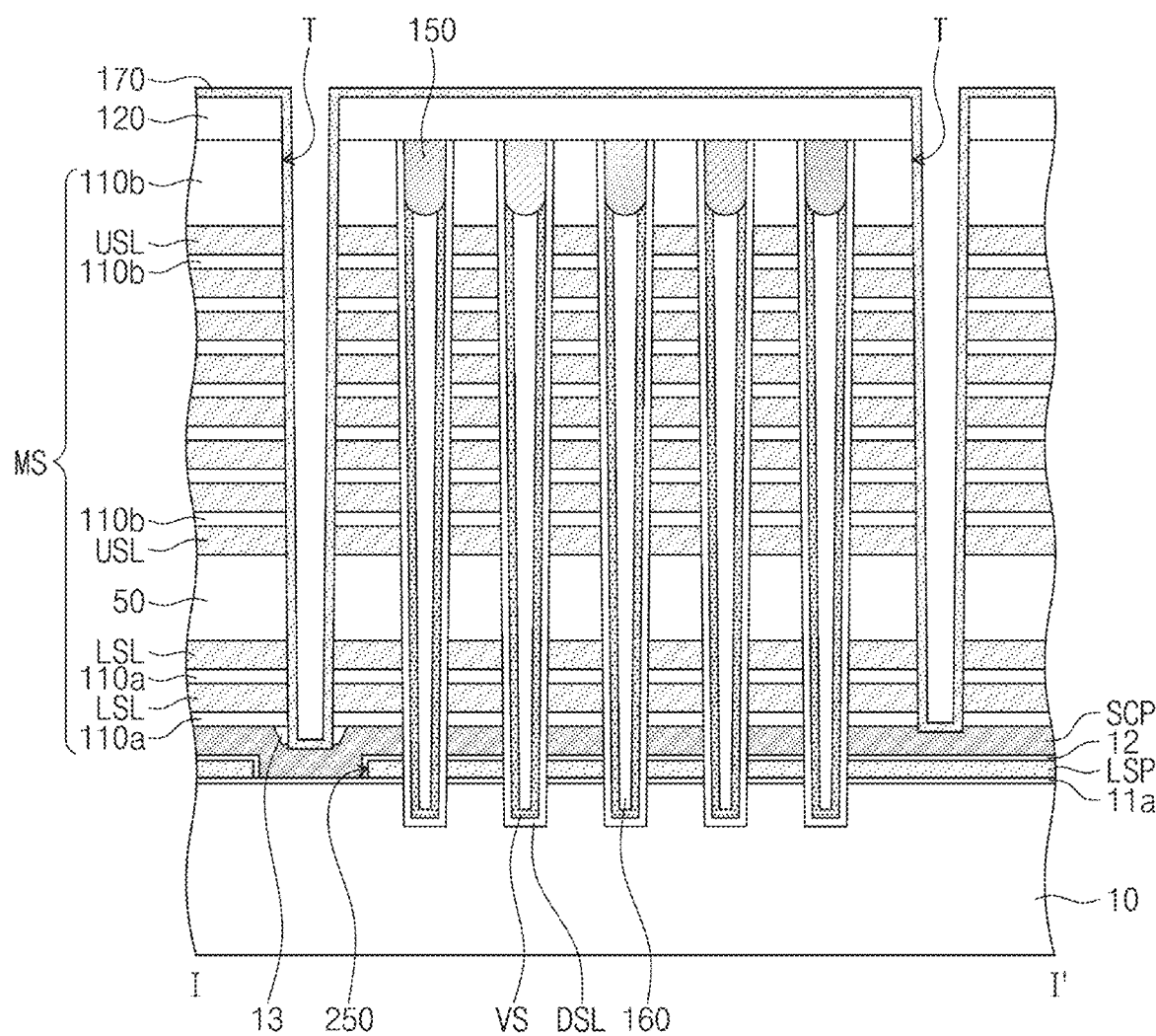

Referring to FIGS. 2 and 17, trenches T may be formed to penetrate the capping insulation layer 120 and the mold structure MS to expose the source conductive layer SCP. The trenches T may extend in the second direction D2 and may be spaced apart from each other in the third direction D3. The trenches T may be laterally spaced apart from the vertical structure VP. A sacrificial spacer layer 170 may be formed on an inner surface of each of the trenches T. The sacrificial spacer layer 170 may fill a portion of each of the trenches T and may be formed to cover the inner surface of each of the trenches T with a uniform thickness. The sacrificial spacer layer 170 may include a material having an etch selectivity with respect to the mold structure MS. For example, the sacrificial spacer layer 170 may include polysilicon.

Figure 18:
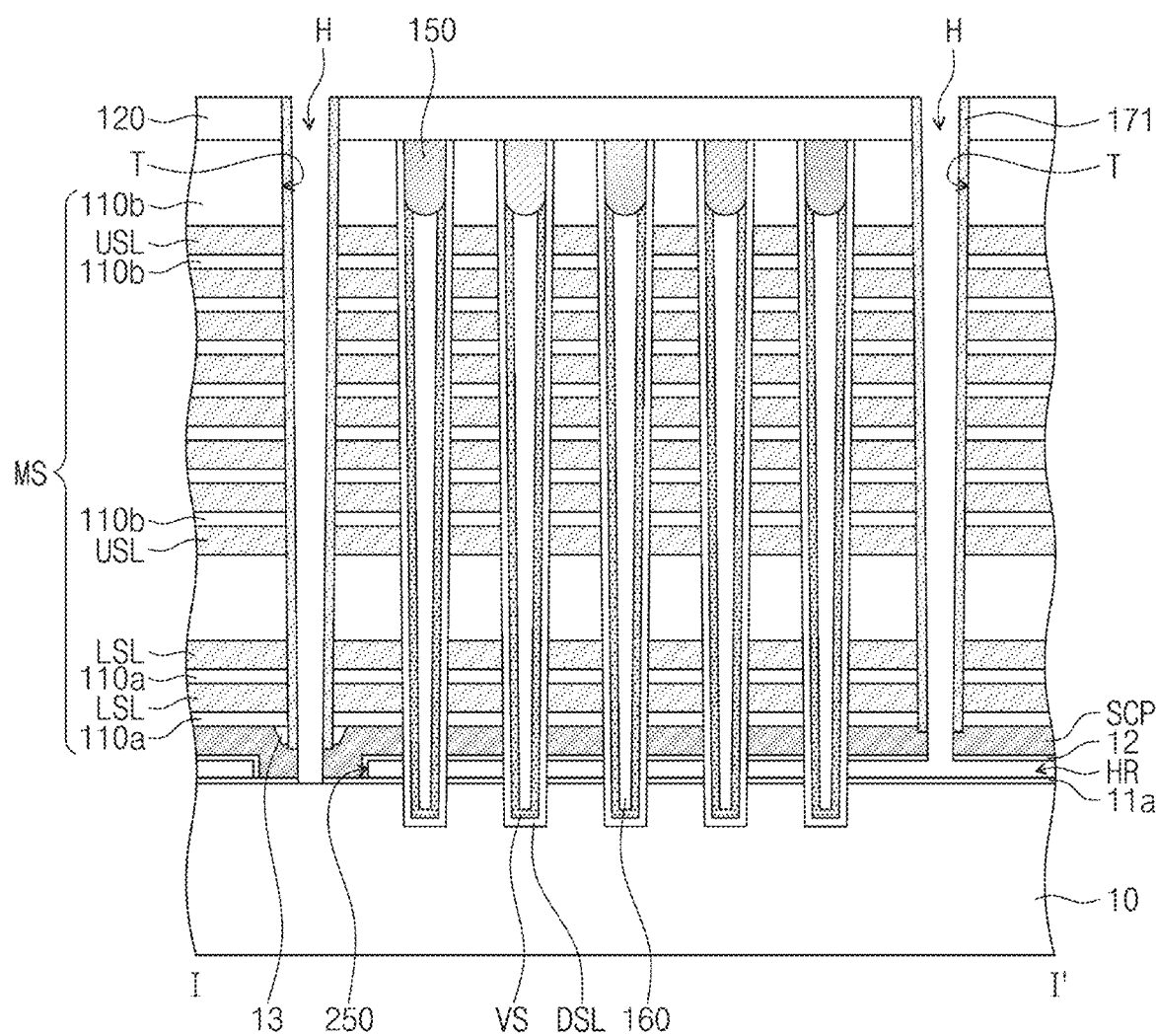

Referring to FIGS. 2 and 18, the sacrificial spacer layer 170 may be anisotropically etched to form a sacrificial spacer 171 on the inner surface of each of the trenches T. When the sacrificial spacer layer 170 is anisotropically etched, a portion of the source conductive layer SCP exposed by each of trenches T and a portion of the buffer insulation layer 12 may also be etched, such that a through hole H may be formed in each of the trenches T to expose the lower sacrificial pattern LSP. The lower sacrificial pattern LSP exposed by the through hole H may be removed by performing an isotropic etch process, such that a horizontal recess region HR may be formed to expose a portion of the data storage layer DSL. The isotropic etch process may be performed using an etch condition having an etch selectivity with respect to the sacrificial spacer 171, the source conductive layer SCP, the buffer insulation layer 12, and the insulation layer 11a. The horizontal recess region HR may horizontally extend between the source conductive layer SCP and the substrate 10 from the through hole H and may be an empty space between the source conductive layer SCP and the substrate 10. A portion of the source conductive layer SCP filled inside the opening 250 of the lower sacrificial pattern LSP may serve as a support to prevent the mold structure MS from collapsing during the formation of the horizontal recess region HR.

Figure 19:
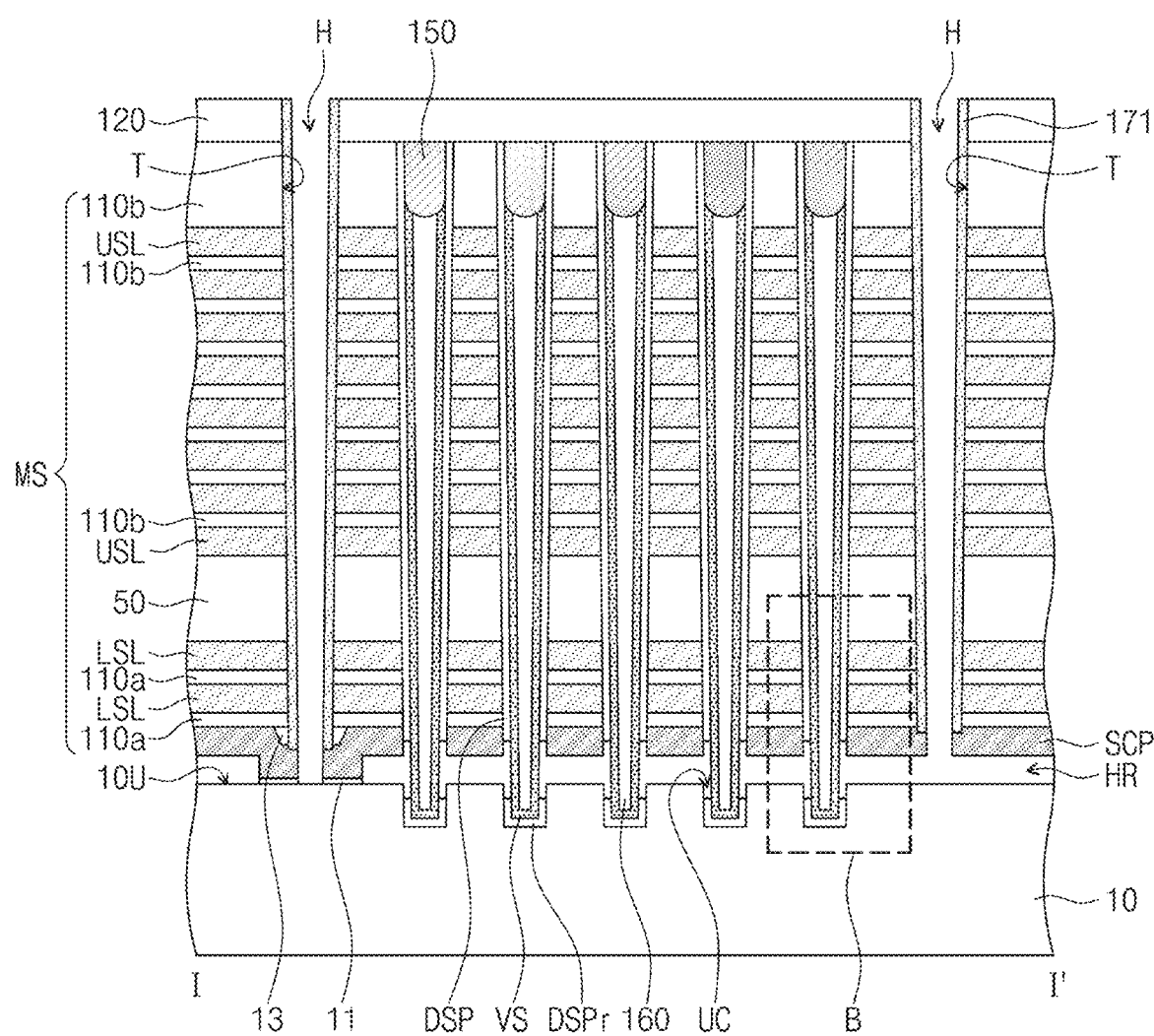

Referring to FIGS. 2 and 19, a portion of the data storage layer DSL exposed by the horizontal recess region HR may be removed to expose a portion of a sidewall of the vertical semiconductor pattern VS, such that the data storage layer DSL may be divided into the data storage pattern DSP and the dummy data storage pattern DSPr that are vertically spaced apart from each other. The removal of the portion of the data storage layer DSL may include removing a portion of the insulation layer 11a and the buffer insulation layer 12 by performing an etch process using an etch selectivity with respect to the substrate 10, the source conductive layer SCP, the vertical semiconductor pattern VS, and the sacrificial spacer 171. Thus, a lower surface of the source conductive layer SCP and the upper surface 10U of the substrate 10 may be exposed by the horizontal recess region HR, and the insulation layer 11 contacting a portion of the source conductive layer SCP may be left on the substrate 10. As the portion of the data storage layer DSL is removed, an undercut region UC may be formed. The undercut region UC may be an empty space extending vertically (e.g., in the first direction D1) from the horizontal recess region HR. The undercut region UC may extend between the sidewall of the vertical semiconductor pattern VS and a sidewall of the source conductive layer SCP and between the sidewall of the semiconductor pattern VS and the substrate 10. The undercut region UC may expose a lower surface of the data storage pattern DSP and an upper surface of the dummy data storage pattern DSPr. As the etch process of removing the portion of the data storage layer DSL is variously changed, a profile of the lower surface of the data storage pattern DSP and a profile of the upper surface of the dummy data storage pattern DSPr may be variously changed.

Figure 23A:
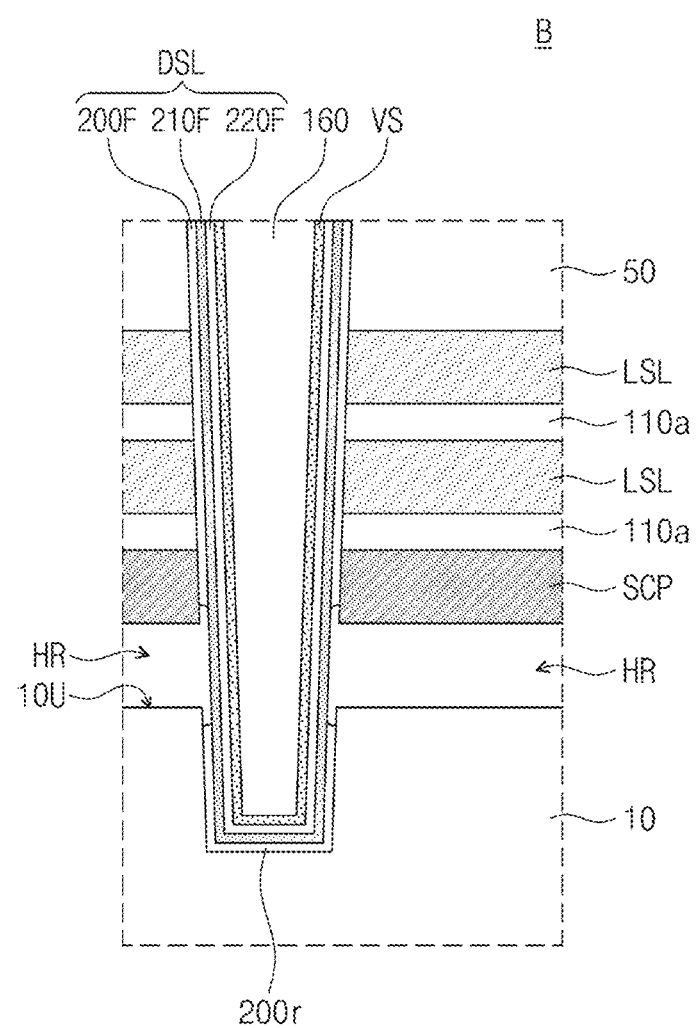
FIGS. 23A, 23B, 23C, 24, 25A, 25B, 26A, 26B, and 27 are views illustrating a method of forming a data storage pattern of a three-dimensional semiconductor memory device and are enlarged views corresponding to portion B of FIG. 19.
Figure 23B:
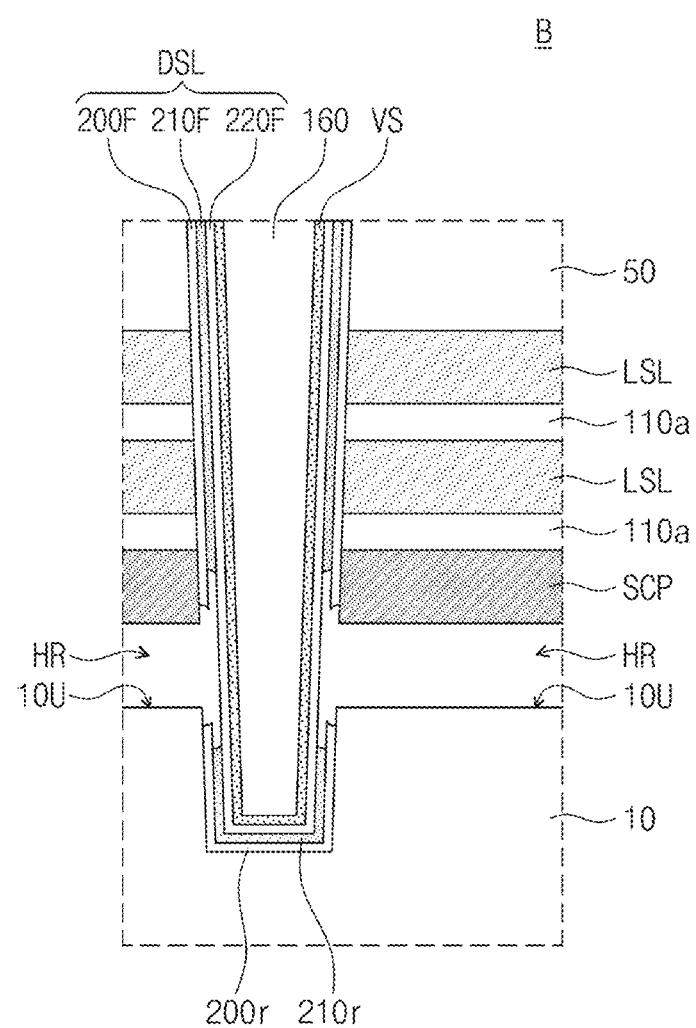
Figure 23C:
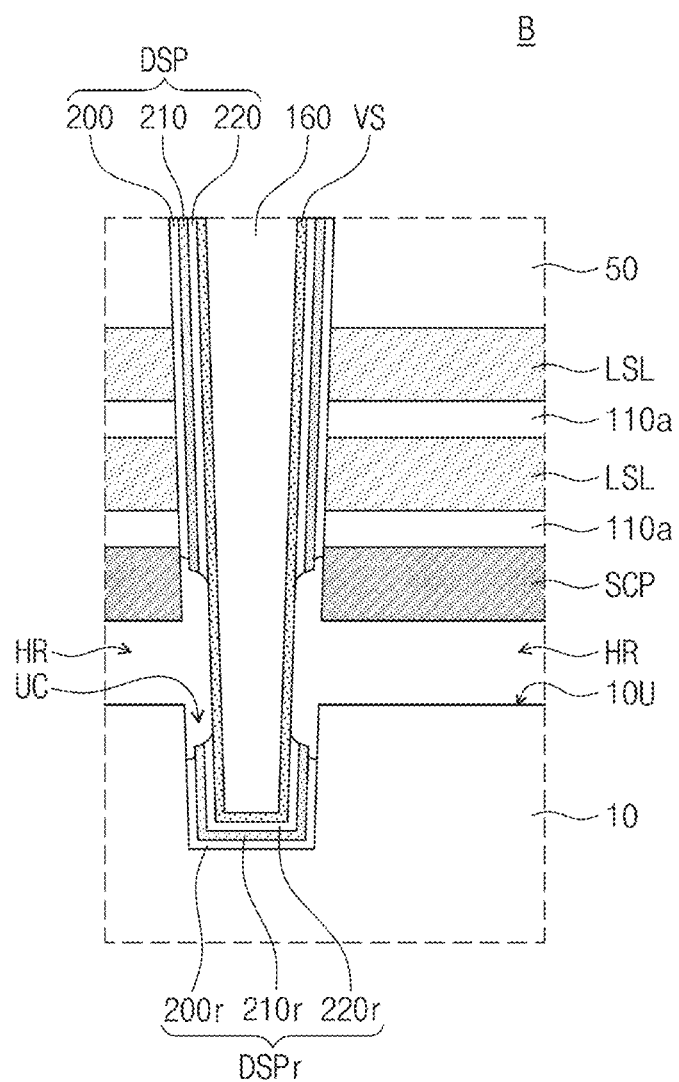

FIGS. 23A, 23B, and 23C illustrate an example of a method of forming the data storage pattern DSP and are enlarged views corresponding to portion B of FIG. 19.

Referring to FIG. 23A, the data storage layer DSL may include a first insulation layer 210F between the vertical semiconductor pattern VS and the mold structure MS, a second insulation layer 200F between the first insulation layer 210F and the mold structure MS, and a third insulation layer 220F between the first insulation layer 210F and the vertical semiconductor pattern VS. The first insulation layer 210F, the second insulation layer 200F, and the third insulation layer 220F may correspond to a charge storage layer, a blocking insulation layer, and a tunnel insulation layer, respectively, of a NAND flash memory device. The horizontal recess region HR may expose the second insulation layer 200F of the data storage layer DSL. The removal of the portion of the data storage layer DSL may include etching a portion of the second insulation layer 200F by performing a first etch process. The first etch process may be performed using an etch condition having an etch selectivity with respect to the substrate 10, the source conductive layer SCP, the sacrificial spacer 171, and the first insulation layer 210F. A portion of the insulation layer 11a and the buffer insulation layer 12 may be removed by a first etch process, thus exposing the first insulation layer 210F. A remaining portion (e.g., second dummy insulation pattern 200r) of the second insulation layer 200F may be left in the substrate 10 due to the first etch process. The first etch process may be a wet etch process using, e.g., hydrofluoric acid (HF).

Referring to FIG. 23B, the removal of the portion of the data storage layer DSL may include etching a portion of the first insulation layer 210F by performing a second etch process. The second etch process may be performed using an etch condition having an etch selectivity with respect to the substrate 10, the source conductive layer SCP, the sacrificial spacer 171, and the second and third insulation layers 200F and 220F. Due to the second etch process, the third insulation layer 220F may be exposed and a remaining portion (e.g., first dummy insulation pattern 210r) of the first insulation layer 210F may be left in the substrate 10. The second etch process may be a wet etch process using, e.g., phosphoric acid.

Referring to FIG. 23C, the removal of the portion of the data storage layer DSL may include etching a portion of the third insulation layer 220F by performing a third etch process. The third etch process may be performed using an etch condition having an etch selectivity with respect to the substrate 10, the source conductive layer SCP, the sacrificial spacer 171, the vertical semiconductor pattern VS, and the first insulation layer 210F. A portion of the second insulation layer 200F may also be etched by the third etch process. Due to the third etch process, the sidewall of the vertical semiconductor pattern VS may be exposed and a remaining portion (e.g., third dummy insulation pattern 220r) of the third insulation layer 220F may be left in the substrate 10. The third etch process may be a wet etch process using, e.g., hydrofluoric acid.

By performing the first to third etch processes, the undercut region UC may be formed. The first insulation layer 210F may be divided into the first insulation pattern 210 and the first dummy insulation pattern 210r that are vertically spaced apart from each other by the undercut region UC. The second insulation layer 200F may be divided into the second insulation pattern 200 and the second dummy insulation pattern 200r that are vertically spaced apart from each other by the undercut region UC. The third insulation layer 220F may be divided into the third insulation pattern 220 and the third dummy insulation pattern 220r that are vertically spaced apart from each other by the undercut region UC. The first to third insulation patterns 210, 200, and 220 may constitute the data storage pattern DSP. The first dummy insulation pattern 210r, the second dummy insulation pattern 200r, and the third dummy insulation pattern 220r may correspond to the remaining portion (e.g., first dummy insulation pattern 210r) of the first insulation layer 210F, the remaining portion (e.g., second dummy insulation pattern 200r) of the second insulation layer 200F, and the remaining portion (e.g., third dummy insulation pattern 220r) of the third insulation layer 220F, respectively, and may constitute the dummy data storage pattern DSPr. By controlling the etch conditions of the first to third etch processes, the data storage pattern DSP may be formed to have the structure in which the lower surface 200L of the second insulation pattern 200 is positioned higher than the lower surface 210L of the first insulation pattern 210 and the lower surface 220L of the third insulation pattern 220 is positioned lower than the lower surface 210L of the first insulation pattern 210, as shown in FIGS. 6A and 6B.

Figure 24:
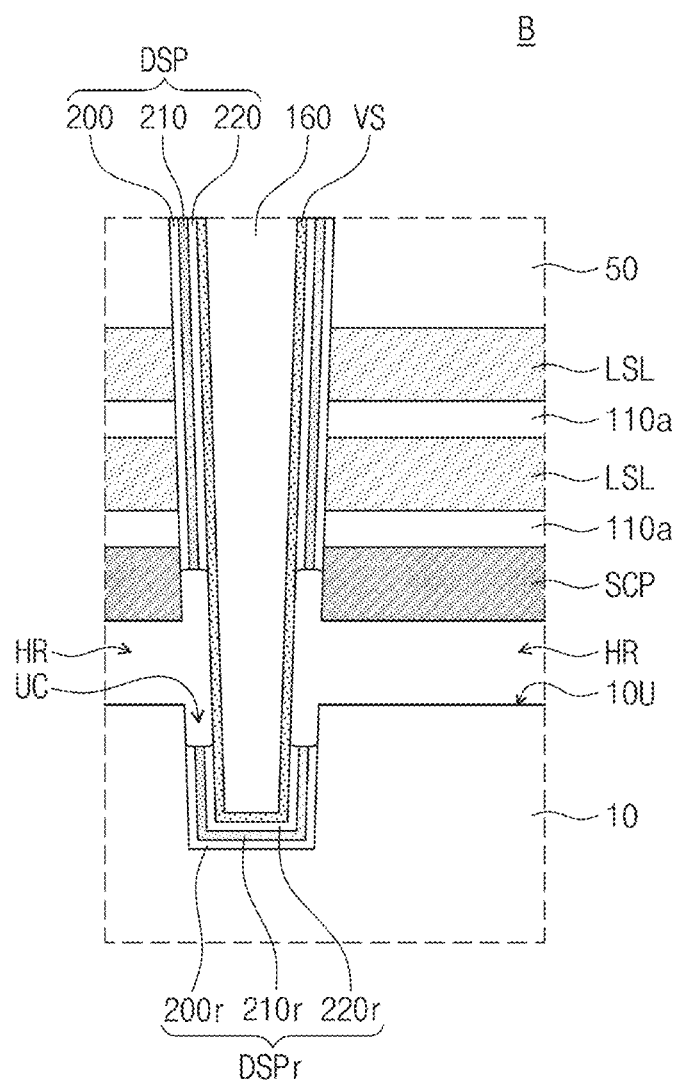

FIG. 24 illustrates an example of a method of forming the data storage pattern DSP and is an enlarged view corresponding to portion B of FIG. 19.

First, as described with reference to FIGS. 23A and 23B, by performing the first and second etch processes, the portion of the second insulation layer 200F and the portion of the first insulation layer 210F may be etched. The third insulation layer 220F may be exposed by the second etch process.

Referring to FIG. 24, the removal of the portion of the data storage layer DSL may include etching a portion of the third insulation layer 220F by performing a fourth etch process. The fourth etch process may be performed using an etch condition having an etch selectivity with respect to the substrate 10, the source conductive layer SCP, and the sacrificial spacer 171. The etch condition of the fourth etch process may not have an etch selectivity with respect to the first to third insulation layers 210F, 200F, and 220F. Etch rates of the first to third insulation layers 210F, 200F, and 220F may be substantially equal (e.g., equal within manufacturing tolerances and/or material tolerances) under the etch condition of the fourth etch process. A portion of each of the first to third insulation layers 210F, 200F, and 220F may be etched. The sidewall of the vertical semiconductor pattern VS may be exposed by the fourth etch process.

The undercut recess region UC may be formed by performing the first, second, and fourth etch processes. Thus, the data storage pattern DSP including the first to third insulation patterns 210, 200, and 220 and the dummy data storage pattern DSPr including the first to third dummy insulation patterns 210r, 200r, and 220r may be formed. According to some example embodiments, the fourth etch process may be performed using the etch condition that does not have an etch selectivity with respect to the first to third insulation layers 210F, 200F, and 220F, but an etch amount of the first insulation layer 210F may be less than an etch amount of each of the second and third insulation layers 200F and 220F by a micro-loading effect of the etch process during the fourth etch process. Thus, the data storage pattern DSP may be formed to have the substantially flat (e.g., flat within manufacturing tolerances and/or material tolerances) lower surface DSP_L, as show in FIGS. 7A and 7B.

Figure 25A:
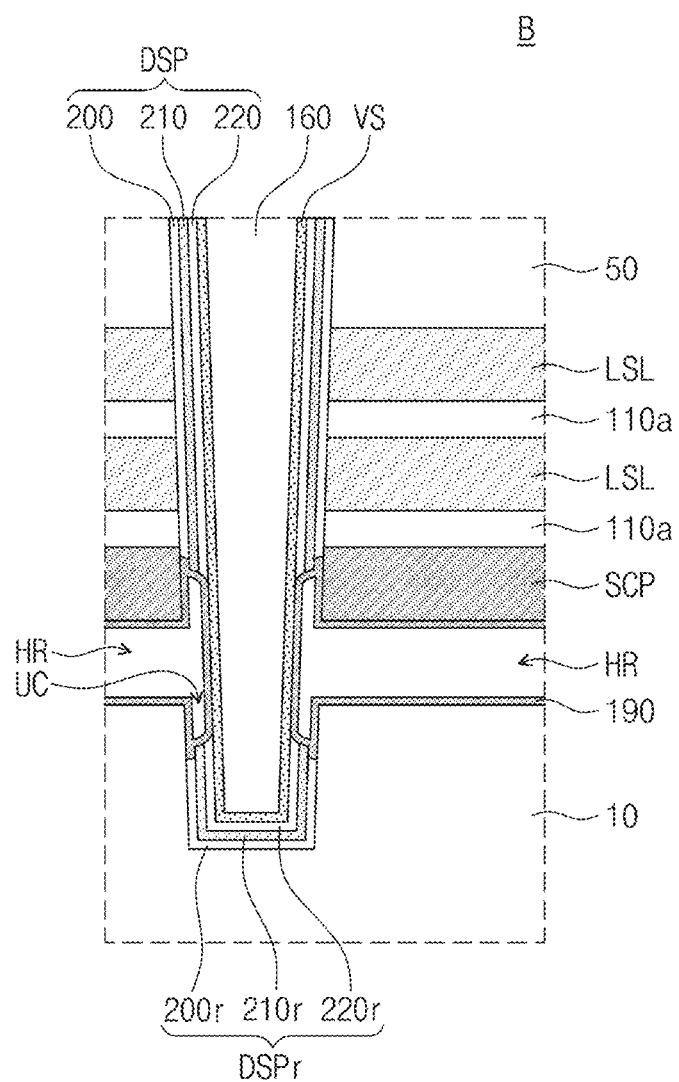
Figure 25B:
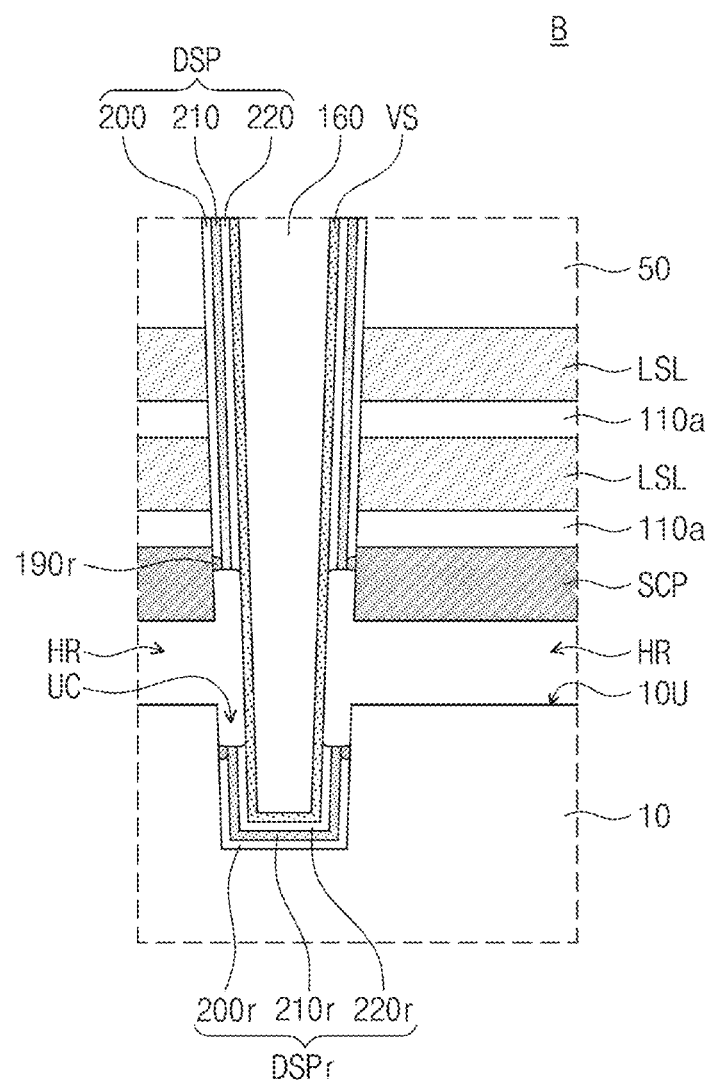

FIGS. 25A and 25B illustrate an example of a method of forming the data storage pattern DSP and are enlarged views corresponding to portion B of FIG. 19.

As described with reference to FIGS. 23A to 23C, the portion of the first insulation layer 210F, the portion of the second insulation layer 200F, and the portion of the third insulation layer 220F may be etched by performing the first to third etch processes. The sidewall of the vertical semiconductor pattern VS may be exposed by the third etch process. The undercut region UC may be formed by the first to third etch processes.

Referring to FIG. 25A, a fourth insulation layer 190 may be formed to cover inner surfaces of the horizontal recess region HR and the undercut recess region UC. The fourth insulation layer 190 may cover the inner surfaces of the horizontal recess region HR and the undercut recess region UC with a uniform thickness. The fourth insulation layer 190 may be formed by, e.g., an atomic layer deposition process. In some example embodiments, the fourth insulation layer 190 may include a different material from the second insulation layer 200F. In other embodiments, the fourth insulation layer 190 may include the same material as the second insulation layer 200F and may include a material less dense than a material of the second insulation layer 200F. For example, the fourth insulation layer 190 may include silicon oxide.

Referring to FIG. 25B, a portion of the fourth insulation layer 190 may be removed from the inner surfaces of the horizontal recess region HR and the undercut region UC. The removal of the fourth insulation layer 190 may include performing a fifth etch process using an etch condition having an etch selectivity with respect to the substrate 10, the source conductive layer SCP, the sacrificial spacer 171, and the vertical semiconductor pattern VS. The sidewall of the vertical semiconductor pattern VS may be exposed by the fifth etch process. A remaining portion 190r of the fourth insulation layer 190 may fill a portion of the undercut region UC. The remaining portion 190r of the fourth insulation layer 190 may cover a lower surface of the second insulation pattern 200. The remaining portion 190r of the fourth insulation layer 190 may correspond to the second portion P2 of the second insulation pattern 200 described with reference to FIGS. 8A and 8B. According to some example embodiments, the data storage pattern DSP may be formed to have the substantially flat (e.g., flat within manufacturing tolerances and/or material tolerances) lower surface DSP_L, as shown in FIGS. 8A and 8B.

Figure 26A:
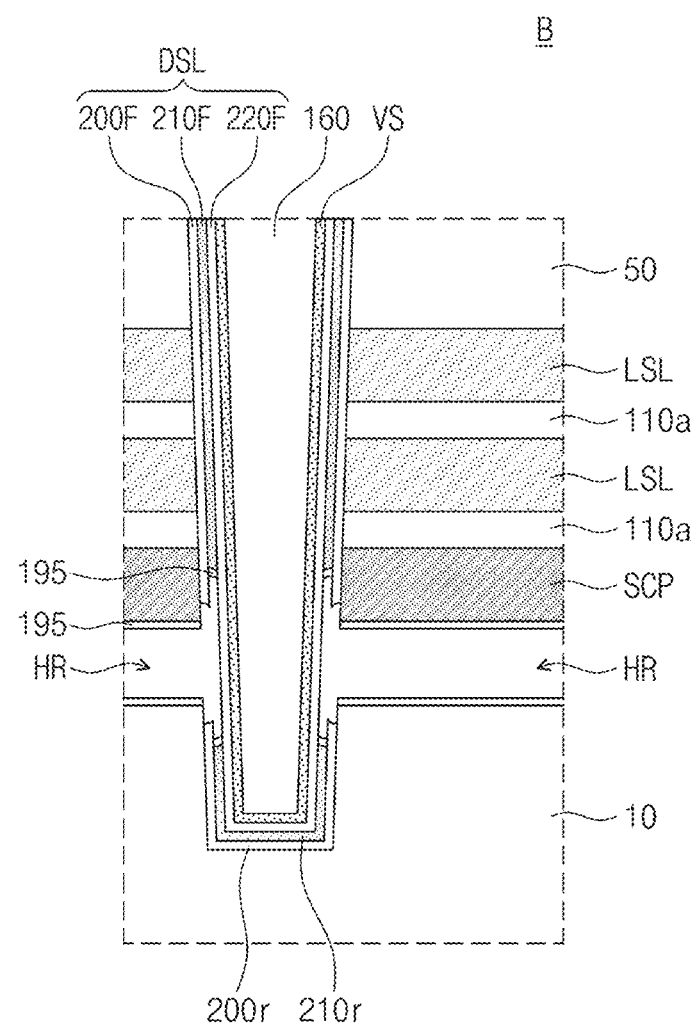
Figure 26B:
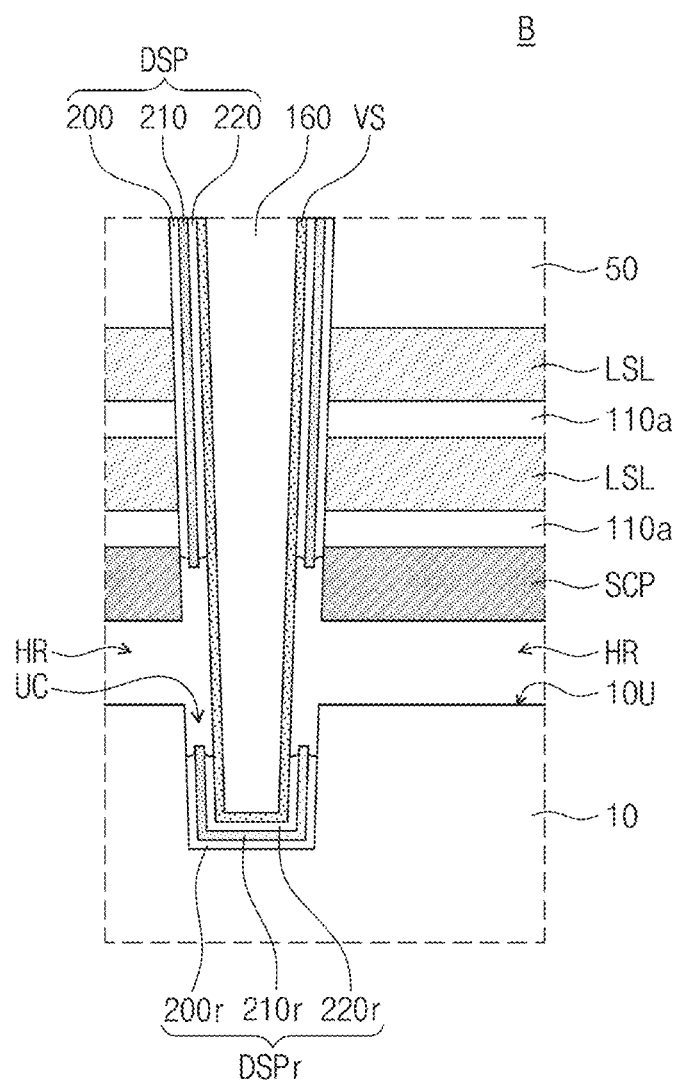

FIGS. 26A and 26B illustrate an example of a method of forming the data storage pattern DSP and are enlarged views corresponding to portion B of FIG. 19.

First, as described with reference to FIGS. 23A and 23B, by performing the first and second etch processes, the portion of the second insulation layer 200F and the portion of the first insulation layer 210F may be etched. The third insulation layer 220F may be exposed by the second etch process.

Referring to FIG. 26A, an oxidation process may be performed. Thus, an end portion of the first insulation layer 210F, a lower surface of the source conductive layer SCP, and the upper surface 10U of the substrate 10 may be oxidized to form an oxide layer 195.

Referring to FIG. 26B, after forming the oxide layer 195, a portion of the third insulation layer 220F may be etched by performing the third etch process described with reference to FIG. 23C. By the third etch process, a portion of the second insulation layer 200F may be also etched and the sidewall of the vertical semiconductor pattern VS may be exposed. According to some example embodiments, the oxide layer 195 may reduce and/or minimize the etch of the first insulation layer 210F during the third etch process. Thus, the first insulation pattern 210 may be formed to protrude further than the second and third insulation patterns 200 and 220 toward the substrate 10, as shown in FIGS. 9A and 9B. The oxide layer 195 may be removed during the third etch process.

Figure 27:
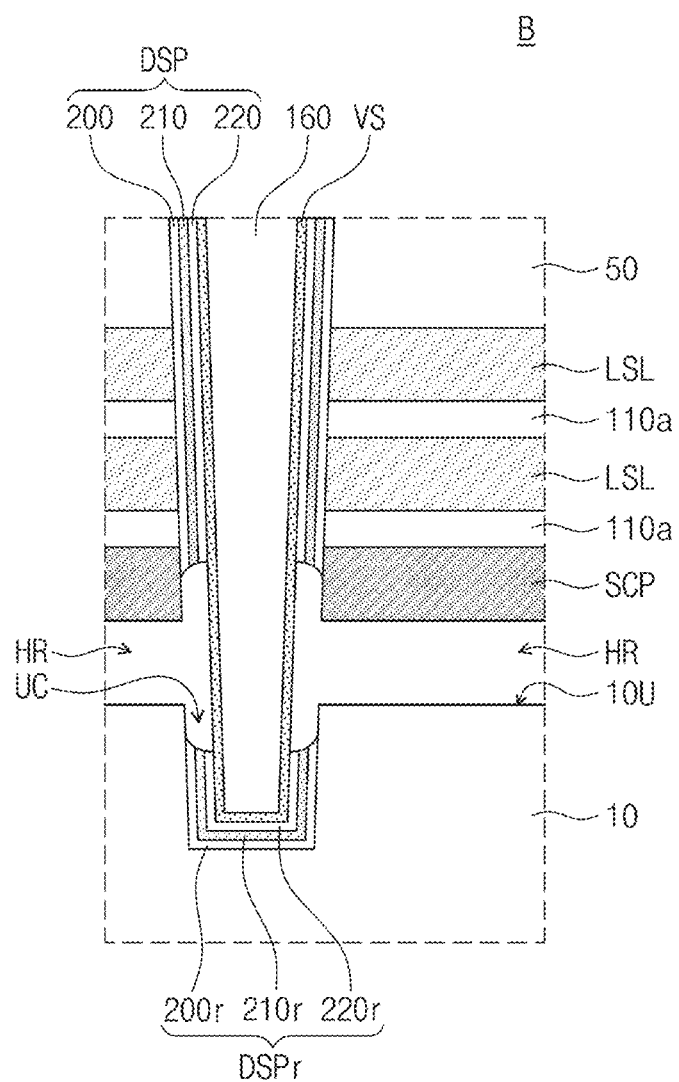

FIG. 27 illustrates an example of a method of forming the data storage pattern DSP and is an enlarged view corresponding to portion B of FIG. 19.

Referring to FIG. 27, the removal of the portion of the data storage layer DSL may include etching a portion of the data storage layer DSL by performing an etch process using an etch condition having an etch selectivity with respect to the substrate 10, the source conductive layer SCP, the vertical semiconductor pattern VS, and the sacrificial spacer 171. By controlling the etch condition of the etch process, the data storage pattern DSP may be formed to have the structure in which the lower surface 200L of the second insulation pattern 200 is positioned lower than the lower surface 210L of the first insulation pattern 210 and the lower surface 220L of the third insulation pattern 220 is positioned higher than the lower surface 210L of the first insulation pattern 210, as shown in FIGS. 10A and 10B.

Figure 20:
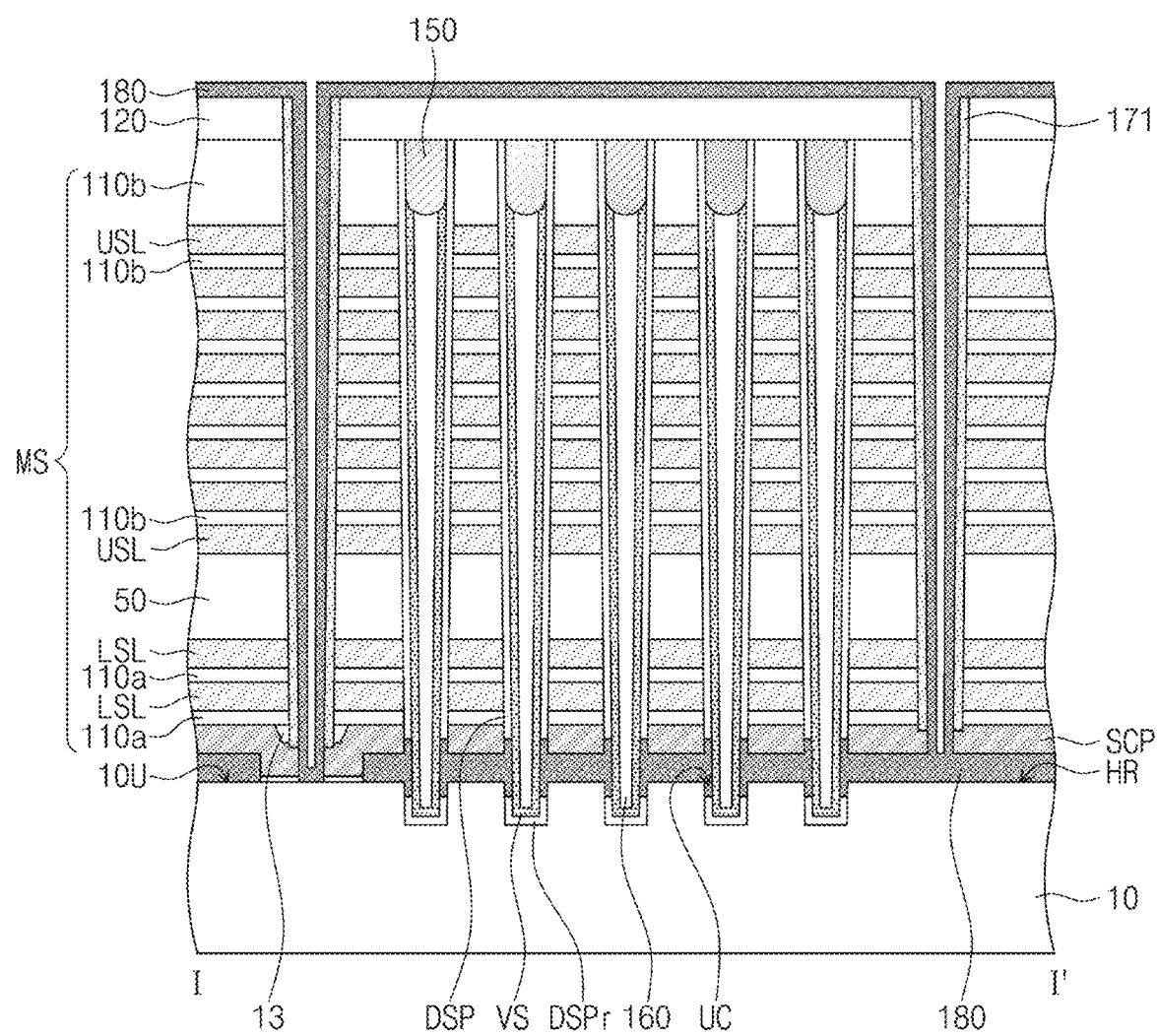

Referring to FIGS. 2 and 20, a sidewall conductive layer 180 may be formed in the undercut region UC, the horizontal recess region HR, and the through hole H. The sidewall conductive layer 180 may be formed by a chemical vapor deposition process or an atomic layer deposition process. The sidewall conductive layer 180 may be an impurity-doped semiconductor layer, e.g., an N-type impurity-doped polysilicon layer. The sidewall conductive layer 180 may cover the inner surfaces of the undercut region UC, the horizontal recess region HR, and the through hole H with a uniform thickness by the deposition process and may not fill completely the through hole H. During the deposition of the sidewall conductive layer 180, the air gap AG or the seam, shown in FIG. 6A, may be formed in the horizontal recess region HR. The sidewall conductive layer 180 may directly contact the sidewall of the vertical semiconductor pattern VS and the upper surface 10U of the substrate 10.

Figure 21:
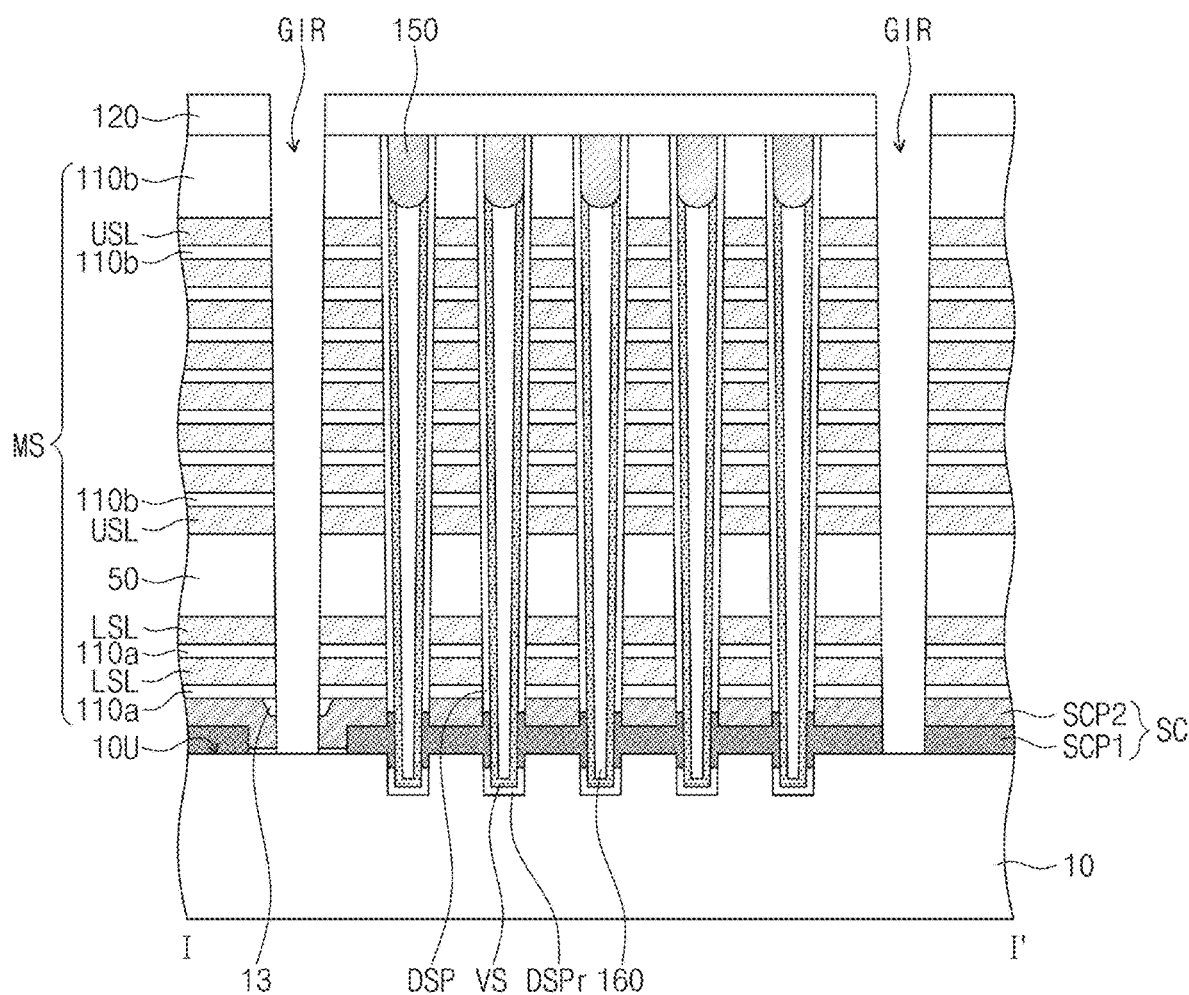

Referring to FIGS. 2 and 21, an isotropic etch process may be performed on the sidewall conductive layer 180 to form the first source conductive pattern SCP1 in the undercut region UC and the horizontal recess region HR. During the isotropic etch process of the sidewall conductive layer 180, the sacrificial spacer 171 may be removed, such that gate separation regions GIR exposing a sidewall of the mold structure MS may be formed. The isotropic etch process may be performed using an etch condition having an etch selectivity with respect to the mold structure MS. As an example, the isotropic etch process etching the sidewall conductive layer 180 and the sacrificial spacer 171 may be a wet etch process using standard clean 1 (SC1) or an ammonium hydroxide (NH4OH) solution, The source conductive layer SCP may be etched during the isotropic etch process of the sidewall conductive layer 180. The second source conductive pattern SCP2 may be formed by the etch of the source conductive layer SCP. The first source conductive pattern SCP1 and the second source conductive pattern SCP2 may constitute the source structure SC. The gate separation regions GIR may expose the sidewall of the mold structure MS, a sidewall of the source structure SC, and the upper surface 10U of the substrate 10.

Figure 22:
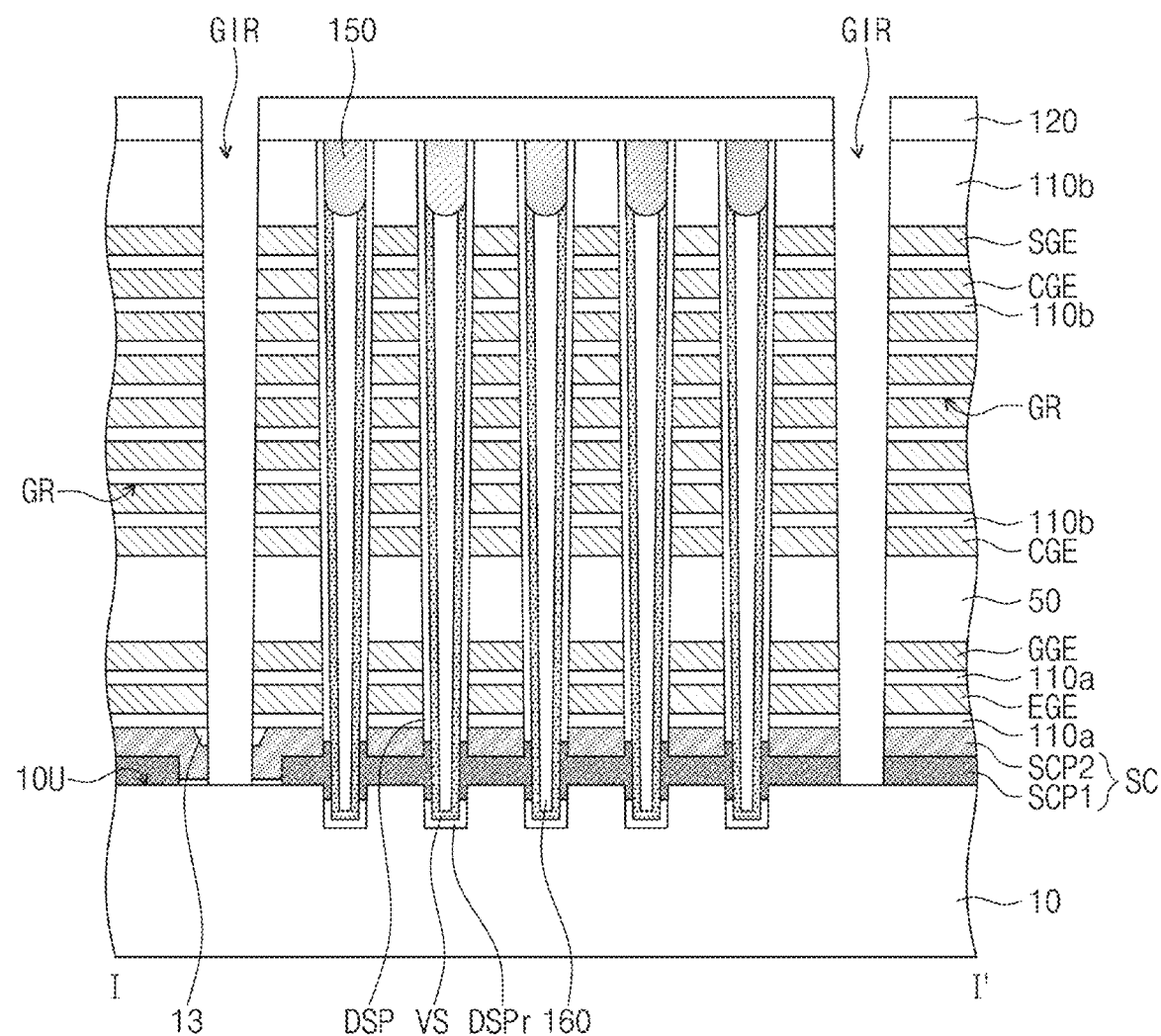

Referring to FIGS. 2 and 22, the lower and upper sacrificial layers LSL and USL exposed by the gate separation regions GIR may be removed. Thus, gate regions GR may be formed between the lower insulation layers 110a and between the upper insulation layers 110b. The formation of the gate regions GR may include etching the lower and upper sacrificial layers LSL and USL by performing an isotropic etch process using an etch condition having an etch selectivity with respect to the lower and upper insulation layers 110a and 110b, the data storage pattern DSP, the first and second source conductive patterns SCP1 and SCP2, and the substrate 10. Each of the gate regions GR may horizontally extend from a corresponding one of the gate separation regions GIR and may expose a portion of a sidewall of the data storage pattern DSP. Thereafter, the gate electrodes EGE, GGE, CGE, and SGE may be formed to fill the gate regions GR. The formation of the gate electrodes EGE, GGE, CGE, and SGE may include forming a gate electrode layer to fill the gate separation regions GIR and the gate regions GR and removing a portion of the gate electrode layer filling the gate separation regions GIR and the gate regions GR to locally form the gate electrodes EGE, GGE, CGE, and SGE in the gate regions GR, for example.

Referring again to FIGS. 2 and 3, the common source plugs CSP may be formed in the gate separation regions GIR, respectively, and the sidewall insulation spacers SS may be formed in the gate separation regions GIR, respectively. The common source plugs CSP and the sidewall insulation spacers SS may be locally formed in the gate separation regions GIR, respectively. The first contact 125 may be formed in the capping insulation layer 120 to be connected to the conductive pad 150. The interlayer insulation layer 130 may be formed on the capping insulation layer 120 and may cover an upper surface of the common source plugs CSP. The second contact 135 may be formed in the interlayer insulation layer 130 to be connected to the first contact 125. The bit lines BL may be formed on the interlayer insulation layer 130. The vertical semiconductor patterns VS may include the dummy vertical semiconductor pattern DVS unconnected to the first contact 125 or the second contact 135. Each of the vertical semiconductor patterns VS except for the dummy vertical semiconductor pattern DVS may be electrically connected to a corresponding one of the bit lines BL through the first contact 125 and the second contact 135.

While the present inventive concepts have been particularly shown and described with reference to some example embodiments thereof, it will be understood by those of ordinary skill in the art that various changes in form and details may be made therein without departing from the spirit and scope of the present disclosure as defined by the following claims.

What is claimed is:

1. A three-dimensional semiconductor memory device, comprising:
   a substrate;
   an electrode structure on the substrate, the electrode structure including a plurality of gate electrodes sequentially stacked in a first direction, the first direction extending perpendicular to an upper surface of the substrate;
   a source conductive pattern between the substrate and the electrode structure;
   a vertical semiconductor pattern penetrating the electrode structure and the source conductive pattern; and
   a data storage pattern extending in the first direction, the data storage pattern between the vertical semiconductor pattern and the electrode structure,
   wherein the source conductive pattern includes
      a first source conductive pattern between the substrate and the electrode structure, the first source conductive pattern including a horizontal portion extending in a second direction on the substrate and a vertical portion extending in the first direction from the horizontal portion and covering a portion of a sidewall of the vertical semiconductor pattern, the second direction parallel to the upper surface of the substrate, and
      a second source conductive pattern between the first source conductive pattern and the electrode structure,
   wherein a lower surface of the data storage pattern contacts the vertical portion of the first source conductive pattern,
   wherein a lower portion of the data storage pattern is horizontally between the sidewall of the vertical semiconductor pattern and a sidewall of the second source conductive pattern,
   wherein at least a portion of the vertical portion of the first source conductive pattern is horizontally between the sidewall of the vertical semiconductor pattern and the sidewall of the second source conductive pattern,
   wherein the data storage pattern is isolated from direct contact with a dummy data storage pattern in the first direction with the source conductive pattern therebetween, and wherein an uppermost surface of the dummy data storage pattern contacts a lower surface of the first source conductive pattern.

2. The three-dimensional semiconductor memory device of claim 1, wherein
   the first source conductive pattern and the second source conductive pattern each include a semiconductor material doped with an impurity of a first conductivity-type, and
   a concentration of the impurity in the first source conductive pattern is different from a concentration of the impurity in the second source conductive pattern.

3. The three-dimensional semiconductor memory device of claim 1, wherein the lower surface of the data storage pattern is substantially flat.

4. The three-dimensional semiconductor memory device of claim 1, wherein
   the data storage pattern includes
      a first insulation pattern between the vertical semiconductor pattern and the electrode structure, and
      a second insulation pattern between the first insulation pattern and the electrode structure,
   a lower surface of each of the first insulation pattern and the second insulation pattern contacts the vertical portion of the first source conductive pattern, and the first insulation pattern includes a different material from the second insulation pattern.

5. The three-dimensional semiconductor memory device of claim 4, wherein
the data storage pattern further include a third insulation pattern between the first insulation pattern and the vertical semiconductor pattern,
a lower surface of the third insulation pattern contacts the vertical portion of the first source conductive pattern, and
the first insulation pattern includes a different material from the third insulation pattern.

6. The three-dimensional semiconductor memory device of claim 1, wherein the uppermost surface of the dummy data storage pattern is lower than the upper surface of the substrate.

7. The three-dimensional semiconductor memory device of claim 1, wherein the uppermost surface of the dummy data storage pattern contacts the vertical portion of the first source conductive pattern.

8. The three-dimensional semiconductor memory device of claim 1, wherein the dummy data storage pattern and the data storage pattern include a same material.

9. The three-dimensional semiconductor memory device of claim 1, further comprising:
a common source plug penetrating the electrode structure and isolated from direct contact with the vertical semiconductor pattern,
wherein the common source plug is connected to the substrate.

10. A three-dimensional semiconductor memory device, comprising:
a substrate;
an electrode structure on the substrate, the electrode structure including a plurality of gate electrodes sequentially stacked in a first direction, the first direction extending perpendicular to an upper surface of the substrate;
a source conductive pattern between the substrate and the electrode structure;
a vertical semiconductor pattern penetrating the electrode structure and the source conductive pattern; and
a data storage pattern extending in the first direction, the data storage pattern between the vertical semiconductor pattern and the electrode structure,
wherein a lower surface of the data storage pattern contacts the source conductive pattern, and
wherein the lower surface of the data storage pattern is sloped with respect to the upper surface of the substrate.

11. The three-dimensional semiconductor memory device of claim 10, wherein
the data storage pattern includes
a first insulation pattern between the vertical semiconductor pattern and the electrode structure,
a second insulation pattern between the first insulation pattern and the electrode structure, and
a third insulation pattern between the first insulation pattern and the vertical semiconductor pattern, and
the first insulation pattern includes a different material from the second and third insulation patterns.

12. The three-dimensional semiconductor memory device of claim 11, wherein a lower surface of each of the first insulation pattern, the second insulation pattern and the third insulation pattern contacts the source conductive pattern.

13. The three-dimensional semiconductor memory device of claim 11, wherein a lower surface of the first insulation pattern, a lower surface of the second insulation pattern, and a lower surface of the third insulation pattern are aligned with each other while being sloped with respect to the upper surface of the substrate.

14. The three-dimensional semiconductor memory device of claim 13, wherein the lower surface of the second insulation pattern is positioned at a height lower than the lower surface of the first insulation pattern.

15. The three-dimensional semiconductor memory device of claim 14, wherein the lower surface of the third insulation pattern is positioned at a height higher than the lower surface of the first insulation pattern.

16. The three-dimensional semiconductor memory device of claim 10, wherein
the source conductive pattern includes
a first source conductive pattern between the substrate and the electrode structure, and
a second source conductive pattern between the first source conductive pattern and the electrode structure, and
the lower surface of the data storage pattern contacts the first source conductive pattern.

17. The three-dimensional semiconductor memory device of claim 16, wherein
the first source conductive pattern includes a horizontal portion extending in a second direction on the substrate and a vertical portion extending in the first direction from the horizontal portion and covering a portion of a sidewall of the vertical semiconductor pattern, the second direction parallel to the upper surface of the substrate, and
the lower surface of the data storage pattern contacts the vertical portion of the first source conductive pattern.

18. The three-dimensional semiconductor memory device of claim 17, wherein the vertical portion of the first source conductive pattern has a width in the first direction, and the width of the vertical portion of the first source conductive pattern decreases in a direction away from the vertical semiconductor pattern.

19. The three-dimensional semiconductor memory device of claim 10, further comprising:
a dummy data storage pattern in the substrate,
wherein the dummy data storage pattern is isolated from direct contact with the data storage pattern in the first direction with the source conductive pattern therebetween.

20. The three-dimensional semiconductor memory device of claim 19, wherein an uppermost surface of the dummy data storage pattern contacts a lower surface of the source conductive pattern.

* * * * *